United States Patent
Chiba et al.

(10) Patent No.: US 7,817,864 B2
(45) Date of Patent: Oct. 19, 2010

(54) CODING APPARATUS AND DECODING APPARATUS

(75) Inventors: Takuma Chiba, Osaka (JP); Hiroaki Shimazaki, Osaka (JP); Takashi Masuno, Osaka (JP); Kei Tasaka, Nara (JP); Kenjiro Tsuda, Osaka (JP); Tatsuro Juri, Osaka (JP); Katsuo Saigo, Hyogo (JP); Keiichi Ishida, Hyogo (JP)

(73) Assignee: Panasonic Corporation, Osaka (JP)

( * ) Notice: Subject to any disclaimer, the term of this patent is extended or adjusted under 35 U.S.C. 154(b) by 1036 days.

(21) Appl. No.: 11/582,440

(22) Filed: Oct. 18, 2006

(65) Prior Publication Data

US 2007/0092150 A1 Apr. 26, 2007

(30) Foreign Application Priority Data

Oct. 20, 2005 (JP) .............................. 2005-305786

(51) Int. Cl.
*G06K 9/36* (2006.01)
(52) U.S. Cl. ...................................................... 382/232
(58) Field of Classification Search ......... 382/232–233, 382/235–236, 238–239, 244–248, 250–251; 375/240.01, 240.12–240.15
See application file for complete search history.

(56) References Cited

U.S. PATENT DOCUMENTS

| | | | | |
|---|---|---|---|---|
| 7,286,710 B2* | 10/2007 | Marpe et al. | ................. | 382/239 |
| 7,301,485 B2 | 11/2007 | Senda | | |
| 7,305,035 B2 | 12/2007 | Kondo et al. | | |
| 7,379,608 B2* | 5/2008 | Marpe et al. | ................. | 382/247 |
| 7,501,964 B2* | 3/2009 | Mittal et al. | ................. | 341/107 |
| 7,599,435 B2* | 10/2009 | Marpe et al. | ........... | 375/240.16 |
| 7,609,762 B2* | 10/2009 | Crinon et al. | .......... | 375/240.13 |
| 7,660,355 B2* | 2/2010 | Winger et al. | .......... | 375/240.23 |
| 2004/0184544 A1 | 9/2004 | Kondo et al. | | |
| 2005/0099522 A1 | 5/2005 | Kondo et al. | | |
| 2005/0249289 A1 | 11/2005 | Yagasaki et al. | | |
| 2007/0040708 A1 | 2/2007 | Senda | | |

(Continued)

FOREIGN PATENT DOCUMENTS

JP         2003-318740         11/2003

(Continued)

OTHER PUBLICATIONS

Chinese Office Action issued in Chinese Patent Application No. 2006101528208, mailed Jul. 10, 2009.

(Continued)

*Primary Examiner*—Jose L Couso
(74) *Attorney, Agent, or Firm*—McDermott Will & Emery LLP

(57) ABSTRACT

The coding apparatus according to the present invention is a coding apparatus which codes data regarding a moving picture, and includes: a DCT coefficient advanced-coding unit which performs advanced-coding on multivalued data representing a quantized DCT coefficient or a motion vector, so as to reduce the bit length of binary data obtained by binarizing the multivalued data; an advanced-coded coefficient/binary coefficient conversion unit which converts the advanced-coded data obtained by the DCT coefficient advanced-coding unit into the binary data; and an arithmetic coding unit which performs arithmetic coding on the binary data obtained by the advanced-coded coefficient/binary coefficient conversion unit.

30 Claims, 21 Drawing Sheets

U.S. PATENT DOCUMENTS

| | | |
|---|---|---|
| 2008/0056374 A1 | 3/2008 | Kondo et al. |
| 2008/0056375 A1 | 3/2008 | Kondo et al. |
| 2008/0063083 A1 | 3/2008 | Kondo et al. |
| 2008/0260037 A1 | 10/2008 | Kondo et al. |
| 2008/0260038 A1 | 10/2008 | Kondo et al. |
| 2008/0260039 A1 | 10/2008 | Kondo et al. |

FOREIGN PATENT DOCUMENTS

| | | |
|---|---|---|
| JP | 2004-007381 | 1/2004 |
| JP | 2004-135251 | 4/2004 |
| WO | WO 2004/034330 A1 | 4/2004 |
| WO | WO 2005/041420 A1 | 5/2005 |

OTHER PUBLICATIONS

Japanese Office Action, issued in Japanese Patent Application No. 2005-305786, dated Jun. 8, 2010.

* cited by examiner

FIG. 4   Binarization process for DCT coefficients

| Original code value | Binarized code value UEGk prefix TU | UEGk suffix Prefix Separator | Suffix | | Original code value | Binarized code value UEGk prefix TU | UEGk suffix Prefix Separator | Suffix |
|---|---|---|---|---|---|---|---|---|
| 0  | 0              |       |      | | 26 | 1111111111111 | 111 | 0 101 |
| 1  | 10             |       |      | | 27 | 1111111111111 | 111 | 0 110 |
| 2  | 110            |       |      | | 28 | 1111111111111 | 111 | 0 111 |
| 3  | 1110           |       |      | | 29 | 1111111111111 | 1111 | 0 0000 |
| 4  | 11110          |       |      | | 30 | 1111111111111 | 1111 | 0 0001 |
| 5  | 111110         |       |      | | 31 | 1111111111111 | 1111 | 0 0010 |
| 6  | 1111110        |       |      | | 32 | 1111111111111 | 1111 | 0 0011 |
| 7  | 11111110       |       |      | | 33 | 1111111111111 | 1111 | 0 0100 |
| 8  | 111111110      |       |      | | 34 | 1111111111111 | 1111 | 0 0101 |
| 9  | 1111111110     |       |      | | 35 | 1111111111111 | 1111 | 0 0110 |
| 10 | 11111111110    |       |      | | 36 | 1111111111111 | 1111 | 0 0111 |
| 11 | 111111111110   |       |      | | 37 | 1111111111111 | 1111 | 0 1000 |
| 12 | 1111111111110  |       |      | | 38 | 1111111111111 | 1111 | 0 1001 |
| 13 | 11111111111110 |       |      | | 39 | 1111111111111 | 1111 | 0 1010 |
| 14 | 1111111111111  | 1   | 0    | | 40 | 1111111111111 | 1111 | 0 1011 |
| 15 | 1111111111111  | 1   | 1    | | 41 | 1111111111111 | 1111 | 0 1100 |
| 16 | 1111111111111  | 11  | 0 00 | | 42 | 1111111111111 | 1111 | 0 1101 |
| 17 | 1111111111111  | 11  | 0 01 | | 43 | 1111111111111 | 1111 | 0 1110 |
| 18 | 1111111111111  | 11  | 0 10 | | 44 | 1111111111111 | 1111 | 0 1111 |
| 19 | 1111111111111  | 11  | 0 11 | | 45 | 1111111111111 | 11111 | 0 00000 |
| 20 | 1111111111111  | 111 | 0 000 | | : | | | |
| 21 | 1111111111111  | 111 | 0 001 |
| 22 | 1111111111111  | 111 | 0 010 |
| 23 | 1111111111111  | 111 | 0 011 |
| 24 | 1111111111111  | 111 | 0 100 |
| 25 | 1111111111111  | 111 |      |

FIG. 5

```
if (Abs ( synElVal) >= uCoff){
    sufS= Abs (synElVal) .uCoff
    stopLoop= 0
    do {
        if( sufS>= ( 1 << k )){
            put (1)                          ⎤
            sufS= sufS.( 1<<k )              ⎬ Prefix
            k++                              ⎦
        } else {
            put (0)    ←──────────────────────── Separator
            while( k--)                      ⎤
                put( ( sufS>> k ) & 0x01 )   ⎬ Suffix
            stopLoop= 1                      ⎦
        }
    } while( !stopLoop)
}
if( signedValFlag&& synElVal!= 0)   ⎤
    if( synElVal> 0 )               ⎥
        put( 0 )                    ⎬ Sign
else                                ⎥
        put( 1 )                    ⎦
```

FIG. 6

```
DCT coefficient → Binary coefficient        → Advanced-coded coefficient
      0          0                            0 0
      1          10                           0 10
      2          110                          0 110
      3          1110                         0 1110
      4          11110                        0 11110
     ...
     13          11111111111110               0 11111111111110
     14          1111111111111  0             0 1111111111111 0
     15          1111111111111  1 0 0         0 1111111111111 1 0 0
     16          1111111111111  1 0 1         0 1111111111111 1 0 1
     17          1111111111111  11 0 00       1 00000000000010001
     18          1111111111111  11 0 01       1 00000000000010010
     ...
```

FIG. 8

| DCT coefficient | → Binary coefficient | → Advanced-coded coefficient |
|---|---|---|
| 0 | 0 | 00000 |
| 1 | 10 | 00001 |
| 2 | 110 | 00010 |
| 3 | 1110 | 00011 |
| 4 | 11110 | 00100 |
| ... | | |
| 13 | 1111111111110 | 01101 |
| 14 | 1111111111111 0 | 01110 |
| 15 | 1111111111111 1 0 0 | 01111 0 |
| 16 | 1111111111111 1 0 1 | 01111 1 |
| 17 | 1111111111111 11 0 00 | 10000 00 |
| 18 | 1111111111111 11 0 01 | 10000 01 |
| 19 | 1111111111111 11 0 10 | 10000 10 |
| 20 | 1111111111111 11 0 11 | 10000 11 |
| 21 | 1111111111111 111 0 000 | 10001 000 |
| 22 | 1111111111111 111 0 001 | 10001 001 |
| 23 | 1111111111111 111 0 010 | 10001 010 |
| ... | | |

FIG. 11

Binarization process for motion vectors

| Original code value | UEGk prefix TU | UEGk suffix Prefix | Separator | Suffix | Sign |
|---|---|---|---|---|---|
| 0 | 0 | | | | |
| 1 | 10 | | | | 0 |
| -1 | 10 | | | | 1 |
| 2 | 110 | | | | 0 |
| -2 | 110 | | | | 1 |
| 3 | 1110 | | | | 0 |
| -3 | 1110 | | | | 1 |
| 4 | 11110 | | | | 0 |
| -4 | 11110 | | | | 1 |
| 5 | 111110 | | | | 0 |
| -5 | 111110 | | | | 1 |
| 6 | 1111110 | | | | 0 |
| -6 | 1111110 | | | | 1 |
| 7 | 11111110 | | | | 0 |
| -7 | 11111110 | | | | 1 |
| 8 | 111111110 | | | | 0 |
| -8 | 111111110 | | | | 1 |
| 9 | 111111111 | | 0 | 000 | 0 |
| -9 | 111111111 | | 0 | 000 | 1 |
| 10 | 111111111 | | 0 | 001 | 0 |
| -10 | 111111111 | | 0 | 001 | 1 |
| 11 | 111111111 | | 0 | 010 | 0 |
| -11 | 111111111 | | 0 | 010 | 1 |
| 12 | 111111111 | | 0 | 011 | 0 |
| -12 | 111111111 | | 0 | 011 | 1 |
| ... | | | | | |
| 15 | 111111111 | | 0 | 110 | 0 |
| -15 | 111111111 | | 0 | 110 | 1 |
| 16 | 111111111 | | 0 | 111 | 0 |
| -16 | 111111111 | | 0 | 111 | 1 |
| 17 | 111111111 | 1 | 0 | 0000 | 0 |
| -17 | 111111111 | 1 | 0 | 0000 | 1 |
| ... | | | | | |
| 32 | 111111111 | 1 | 0 | 1111 | 0 |
| -32 | 111111111 | 1 | 0 | 1111 | 1 |
| 33 | 111111111 | 11 | 0 | 00000 | 0 |
| -33 | 111111111 | 11 | 0 | 00000 | 1 |
| 34 | 111111111 | 11 | 0 | 00001 | 0 |

FIG. 12

| Motion vector | → Binary vector | | | | → Advanced-coded vector | | | |
|---|---|---|---|---|---|---|---|---|
| 0 | 0 | | | | 0 | 0 | | |
| 1 | 10 | | | 0 | 0 | 10 | | 0 |
| -1 | 10 | | | 1 | 0 | 10 | | 1 |
| 2 | 110 | | | 0 | 0 | 110 | | 0 |
| -2 | 110 | | | 1 | 0 | 110 | | 1 |
| 3 | 1110 | | | 0 | 0 | 1110 | | 0 |
| -3 | 1110 | | | 1 | 0 | 1110 | | 1 |
| 4 | 11110 | | | 0 | 0 | 11110 | | 0 |
| -4 | 11110 | | | 1 | 0 | 11110 | | 1 |
| 5 | 111110 | | | 0 | 0 | 111110 | | 0 |
| -5 | 111110 | | | 1 | 0 | 111110 | | 1 |
| 6 | 1111110 | | | 0 | 0 | 1111110 | | 0 |
| -6 | 1111110 | | | 1 | 0 | 1111110 | | 1 |
| 7 | 11111110 | | | 0 | 0 | 11111110 | | 0 |
| -7 | 11111110 | | | 1 | 0 | 11111110 | | 1 |
| 8 | 111111110 | | | 0 | 0 | 111111110 | | 0 |
| -8 | 111111110 | | | 1 | 0 | 111111110 | | 1 |
| 9 | 111111111 | 0 | 000 | 0 | 0 | 111111111 | 0 | 000 0 |
| -9 | 111111111 | 0 | 000 | 1 | 0 | 111111111 | 0 | 000 1 |
| 10 | 111111111 | 0 | 001 | 0 | 0 | 111111111 | 0 | 001 0 |
| -10 | 111111111 | 0 | 001 | 1 | 0 | 111111111 | 0 | 001 1 |
| 11 | 111111111 | 0 | 010 | 0 | 0 | 111111111 | 0 | 010 0 |
| -11 | 111111111 | 0 | 010 | 1 | 0 | 111111111 | 0 | 010 1 |
| 12 | 111111111 | 0 | 011 | 0 | 0 | 111111111 | 0 | 011 0 |
| -12 | 111111111 | 0 | 011 | 1 | 0 | 111111111 | 0 | 011 1 |
| 13 | 111111111 | 0 | 100 | 0 | 0 | 111111111 | 0 | 100 0 |
| -13 | 111111111 | 0 | 100 | 1 | 0 | 111111111 | 0 | 100 1 |
| 14 | 111111111 | 0 | 101 | 0 | 0 | 111111111 | 0 | 101 0 |
| -14 | 111111111 | 0 | 101 | 1 | 0 | 111111111 | 0 | 101 1 |
| 15 | 111111111 | 0 | 110 | 0 | 0 | 111111111 | 0 | 110 0 |
| -15 | 111111111 | 0 | 110 | 1 | 0 | 111111111 | 0 | 110 1 |
| 16 | 111111111 | 0 | 111 | 0 | 0 | 111111111 | 0 | 111 0 |
| -16 | 111111111 | 0 | 111 | 1 | 0 | 111111111 | 0 | 111 1 |
| 17 | 111111111 | 1 0 | 0000 | 0 | 1 | 00000000010001 | | |
| -17 | 111111111 | 1 0 | 0000 | 1 | 1 | 11111111101111 | | |
| 18 | 111111111 | 1 0 | 0001 | 0 | 1 | 00000000010010 | | |
| -18 | 111111111 | 1 0 | 0001 | 1 | 1 | 11111111101110 | | |
| 19 | 111111111 | 1 0 | 0010 | 0 | 1 | 00000000010011 | | |
| -19 | 111111111 | 1 0 | 0010 | 1 | 1 | 11111111101101 | | |
| 20 | 111111111 | 1 0 | 0011 | 0 | 1 | 00000000010100 | | |
| -20 | 111111111 | 1 0 | 0011 | 1 | 1 | 11111111101100 | | |
| 21 | 111111111 | 1 0 | 0100 | 0 | 1 | 00000000010101 | | |
| -21 | 111111111 | 1 0 | 0100 | 1 | 1 | 11111111101011 | | |
| 22 | 111111111 | 1 0 | 0101 | 0 | 1 | 00000000010110 | | |
| -22 | 111111111 | 1 0 | 0101 | 1 | 1 | 11111111101010 | | |
| 23 | 111111111 | 1 0 | 0110 | 0 | 1 | 00000000010111 | | |
| -23 | 111111111 | 1 0 | 0110 | 1 | 1 | 11111111101001 | | |
| 24 | 111111111 | 1 0 | 0111 | 0 | 1 | 00000000011000 | | |
| -24 | 111111111 | 1 0 | 0111 | 1 | 1 | 11111111101000 | | |
| 25 | 111111111 | 1 0 | 1000 | 0 | 1 | 00000000011001 | | |
| -25 | 111111111 | 1 0 | 1000 | 1 | 1 | 11111111100111 | | |
| 26 | 111111111 | 1 0 | 1001 | 0 | 1 | 00000000011010 | | |
| -26 | 111111111 | 1 0 | 1001 | 1 | 1 | 11111111100110 | | |
| 27 | 111111111 | 1 0 | 1010 | 0 | 1 | 00000000011011 | | |
| -27 | 111111111 | 1 0 | 1010 | 1 | 1 | 11111111100101 | | |
| 28 | 111111111 | 1 0 | 1011 | 0 | 1 | 00000000011100 | | |
| -28 | 111111111 | 1 0 | 1011 | 1 | 1 | 11111111100100 | | |
| 29 | 111111111 | 1 0 | 1100 | 0 | 1 | 00000000011101 | | |
| -29 | 111111111 | 1 0 | 1100 | 1 | 1 | 11111111100011 | | |
| 30 | 111111111 | 1 0 | 1101 | 0 | 1 | 00000000011110 | | |
| -30 | 111111111 | 1 0 | 1101 | 1 | 1 | 11111111100010 | | |
| 31 | 111111111 | 1 0 | 1110 | 0 | 1 | 00000000011111 | | |
| -31 | 111111111 | 1 0 | 1110 | 1 | 1 | 11111111100001 | | |
| 32 | 111111111 | 1 0 | 1111 | 0 | 1 | 00000000000000 | | |
| -32 | 111111111 | 1 0 | 1111 | 1 | 1 | 11111111100000 | | |
| 33 | 111111111 | 11 0 | 00000 | 0 | 1 | 00000000000001 | | |
| -33 | 111111111 | 11 0 | 00000 | 1 | 1 | 11111111011111 | | |
| 34 | 111111111 | 11 0 | 00001 | 0 | 1 | 00000000100010 | | |
| -34 | 111111111 | 11 0 | 00001 | 1 | 1 | 11111111011110 | | |
| 35 | 111111111 | 11 0 | 00010 | 0 | 1 | 00000000000011 | | |
| -35 | 111111111 | 11 0 | 00010 | 1 | 1 | 11111111011101 | | |
| 36 | 111111111 | 11 0 | 00011 | 0 | 1 | 00000000100100 | | |
| -36 | 111111111 | 11 0 | 00011 | 1 | 1 | 11111111011100 | | |
| 37 | 111111111 | 11 0 | 00100 | 0 | 1 | 00000000100101 | | |

FIG. 14

```
Motion vector → Binary vector                    → Advanced-coded vector
    0      0                                        00000
    1     10                       0                00001              0
   -1     10                       1                00001              1
    2    110                       0                00010              0
   -2    110                       1                00010              1
    3    1110                      0                00011              0
   -3    1110                      1                00011              1
    4    11110                     0                00100              0
   -4    11110                     1                00100              1
    5    111110                    0                00101              0
   -5    111110                    1                00101              1
    6    1111110                   0                00110              0
   -6    1111110                   1                00110              1
    7    11111110                  0                00111              0
   -7    11111110                  1                00111              1
    8    111111110                 0                01000              0
   -8    111111110                 1                01000              1
    9    111111111      0    000 0                  01001        000 0
   -9    111111111      0    000 1                  01001        000 1
   10    111111111      0    001 0                  01001        001 0
  -10    111111111      0    001 1                  01001        001 1
   11    111111111      0    010 0                  01001        010 0
  -11    111111111      0    010 1                  01001        010 1
   12    111111111      0    011 0                  01001        011 0
  -12    111111111      0    011 1                  01001        011 1
   13    111111111      0    100 0                  01001        100 0
  -13    111111111      0    100 1                  01001        100 1
   14    111111111      0    101 0                  01001        101 0
  -14    111111111      0    101 1                  01001        101 1
   15    111111111      0    110 0                  01001        110 0
  -15    111111111      0    110 1                  01001        110 1
   16    111111111      0    111 0                  01001        111 0
  -16    111111111      0    111 1                  01001        111 1
   17    111111111    1 0   0000 0                  01010       0000 0
  -17    111111111    1 0   0000 1                  01010       0000 1
   18    111111111    1 0   0001 0                  01010       0001 0
  -18    111111111    1 0   0001 1                  01010       0001 1
   19    111111111    1 0   0010 0                  01010       0010 0
  -19    111111111    1 0   0010 1                  01010       0010 1
   20    111111111    1 0   0011 0                  01010       0011 0
  -20    111111111    1 0   0011 1                  01010       0011 1
   21    111111111    1 0   0100 0                  01010       0100 0
  -21    111111111    1 0   0100 1                  01010       0100 1
   22    111111111    1 0   0101 0                  01010       0101 0
  -22    111111111    1 0   0101 1                  01010       0101 1
   23    111111111    1 0   0110 0                  01010       0110 0
  -23    111111111    1 0   0110 1                  01010       0110 1
   24    111111111    1 0   0111 0                  01010       0111 0
  -24    111111111    1 0   0111 1                  01010       0111 1
   25    111111111    1 0   1000 0                  01010       1000 0
  -25    111111111    1 0   1000 1                  01010       1000 1
   26    111111111    1 0   1001 0                  01010       1001 0
  -26    111111111    1 0   1001 1                  01010       1001 1
   27    111111111    1 0   1010 0                  01010       1010 0
  -27    111111111    1 0   1010 1                  01010       1010 1
   28    111111111    1 0   1011 0                  01010       1011 0
  -28    111111111    1 0   1011 1                  01010       1011 1
   29    111111111    1 0   1100 0                  01010       1100 0
  -29    111111111    1 0   1100 1                  01010       1100 1
   30    111111111    1 0   1101 0                  01010       1101 0
  -30    111111111    1 0   1101 1                  01010       1101 1
   31    111111111    1 0   1110 0                  01010       1110 0
  -31    111111111    1 0   1110 1                  01010       1110 1
   32    111111111    1 0   1111 0                  01010       1111 0
  -32    111111111    1 0   1111 1                  01010       1111 1
   33    111111111   11 0  00000 0                  01011      00000 0
  -33    111111111   11 0  00000 1                  01011      00000 1
   34    111111111   11 0  00001 0                  01011      00001 0
  -34    111111111   11 0  00001 1                  01011      00001 1
   35    111111111   11 0  00010 0                  01011      00010 0
  -35    111111111   11 0  00010 1                  01011      00010 1
   36    111111111   11 0  00011 0                  01011      00011 0
  -36    111111111   11 0  00011 1                  01011      00011 1
   37    111111111   11 0  00100 0                  01011      00100 0
```

FIG. 17

■ When binary coefficient is selected    ■ When advanced-coded coefficient is selected DCT coefficient → Binary coefficient     DCT coefficient → Advanced-coded coefficient

| | | | |
|---|---|---|---|
| 0 | 0 0 | 0 | 1 00000 |
| 1 | 0 10 | 1 | 1 00001 |
| 2 | 0 110 | 2 | 1 00010 |
| 3 | 0 1110 | 3 | 1 00011 |
| 4 | 0 11110 | 4 | 1 00100 |
| ... | | ... | |
| 13 | 0 1111111111110 | 13 | 1 01101 |
| 14 | 0 11111111111111 0 | 14 | 1 01110 |
| 15 | 0 11111111111111 10 | 15 | 1 01111 0 |
| 16 | 0 11111111111111 100 | 16 | 1 01111 1 |
| 17 | 0 11111111111111 101 | 17 | 1 10000 00 |
| 18 | 0 11111111111111 11 00 | 18 | 1 10000 01 |
| 19 | 0 11111111111111 11 001 | 19 | 1 10000 10 |
| 20 | 0 11111111111111 11 010 | 20 | 1 10000 11 |
| 21 | 0 11111111111111 11 011 | 21 | 1 10001 000 |
| 22 | 0 11111111111111 111 0 000 | 22 | 1 10001 001 |
| 23 | 0 11111111111111 111 0 001 | 23 | 1 10001 010 |
| | 0 11111111111111 111 0 010 | | |

Selection bit

CODING APPARATUS AND DECODING APPARATUS

BACKGROUND OF THE INVENTION (1) Field of the Invention

The present invention relates to a coding apparatus which codes data regarding moving pictures (video) and a decoding apparatus which decodes such coded data, and more particularly to a CABAC coding apparatus and a CABAC decoding apparatus.

(2) Description of the Related Art

With development of digital technologies, technologies for coding video have been also progressed and developed. However, video data (especially moving picture data) has a large amount of data. Therefore, when coded digital video data is transmitted as a broadcast or via a medium such as a DVD, the transmitted video data is very large in size. Particularly, video transmitted in high-definition (HD) broadcasting, which has recently been put to practical use, requires six times the amount of data of conventional standard-definition (SD) video.

With the development of digital imaging technologies, data compression technologies have been utilized and developed for digital video data, in order to address increases in the data amount. One example is the development in a data compression technique specialized for video data, which takes advantage of the characteristics of such video data. Moreover, recent improvements in the data processing ability of computers allow complicated computations in compression technologies, so that compression rates of video data have been significantly enhanced. For example, the MPEG-2 standard is one of such compression technologies, and is employed in satellite and terrestrial digital HD broadcasting.

A further developed video compression technology is the AVC/H.264 standard. The AVC/H.264 standard can achieve an increase in compression rate which is about twice as high as the rate of the MPEG-2 standard. The AVC/H.264 standard employs and combines various compression technologies to realize such a high compression rate. As a result, the amount of computations is also increased significantly.

One of the compression technologies employed in the AVC/H.264 standard is entropy coding (variable-length coding). The entropy coding has two different modes: Context-based Adaptive Variable Length Coding (CAVLC); and Context-based Adaptive Binary Arithmetic Coding (CABAC). In the CAVLC mode, when a DCT coefficient is coded, a Run symbol representing a length of a sequence of consecutive 0s and a Level symbol representing a non-zero value immediately following a sequence of 0s are respectively coded in the direction opposite to the scanning direction, referring to respective variable length coding tables.

CABAC is a mode of coding data to be coded by adaptively changing the occurrence probability of the data which varies with time. Such a method is generally called arithmetic coding (see, for example, Japanese Laid-Open Patent Application No. 2004-135251). In CABAC, in addition to such typical arithmetic coding, another technique is used to assign a context to each code to be compressed and change the occurrence probability for each context.

CABAC includes two main processes. The first process is to convert multivalued (non-binary) data to be coded into binary data, which is called binarization. More specifically, "multivalued data to be coded" denotes macroblock information, DCT coefficients, motion vectors, and the like, which are collectively called a syntax. The second process is to calculate a context of the binary data obtained through binarization of the multivalued data and then to apply arithmetic coding to the binary data according to the calculated context.

Generally, binarization is performed for each macroblock of sixteen by sixteen (16×16) pixels, which is the fundamental unit for coding. Therefore, the amount of binary data fluctuates depending on the number of bits of a code value to which DCT and quantization have been applied. On the other hand, since the arithmetic coding process is performed bit by bit, the operation speed is normally one bit per clock.

Therefore, in the case where the amount of binary data varies significantly from macroblock to macroblock, for example, where a lot of binary data concentrates at the end of a slice which is the unit for coding, such binary data cannot be handled in the arithmetic coding process, and thus overflowed. So, a buffer called a bin buffer for temporarily storing binary data is provided between the binarization circuit and the arithmetic coding circuit. By storing binary data in this bin buffer, it becomes possible to avoid a problem of overflow of binary data in the arithmetic coding process, even if the amount of binary data varies significantly from macroblock to macroblock.

FIG. 1 is a diagram which shows a structure of a conventional coding circuit using CABAC. A quantized DCT coefficient is converted to binary data by a DCT coefficient binarization unit 2. This binary data is temporarily stored in a bin buffer 3, and then coded bit by bit by an arithmetic coding unit 4 and then outputted.

FIG. 2 is a diagram which shows a structure of a conventional decoding circuit using CABAC.

The arithmetic-coded DCT coefficient is converted into binary data through bit-by-bit decoding by an arithmetic decoding unit 5. This binary data is temporarily stored in the bin buffer 3, and then converted into a multivalued quantized DCT coefficient by a DCT coefficient conversion unit 6.

Above-mentioned coding and decoding processes are performed not only on DCT coefficients but also on other syntax elements (such as motion vectors and macroblock information) in the same manner.

In CABAC, UEGk (Concatenated unary/k-th order Exp-Golomb) coding is used as a binarization method. UEGk is a concatenation of truncated unary (TU) coding and Exp-Golomb coding. For example, in the case where a DCT coefficient coeff_abs_level_minus1 (value: x) is binarized using UEGk coding, x is binarized by TU (cMax=14) when x is a value less than 14. On the other hand, when x is 14 or larger value, x−14 is binarized by exp_Golomb coding and concatenated to the end of a bit string "111111111111111".

The bit length of binary data is 15 bits when x is 14, 17 bits when x is 15, and 19 bits when x is 17, respectively. The bit length of binary data increases as the value of x becomes larger. Binarization of the largest value of x (where x is 17-bit data) results in the 49-bit length binary data.

As mentioned above, binary data is temporarily stored in the bin buffer 3. However, if DCT coefficients of large values appear consecutively, binary data of long bit length has to be written one after another into the bin buffer 3. In other words, if DCT coefficients of large values appear consecutively, the data transmission rate into the bin buffer 3 becomes high, and therefore a bin buffer with wider bandwidth needs to be provided.

For example, in the case where high-definition video frames each of 1920×1088 pixels are coded at the rate of 30 frames per second, time required for coding one macroblock (16×16 pixels) is 1÷(8160×30)≈4.08 μs. And if DCT coefficients of large values appear consecutively in this macroblock and the binary data of the macroblock has 8,000 bits, the data transmission rate is 1.96 Gbps.

As described above, the conventional structure has a problem that the data transmission rate into the bin buffer 3 becomes significantly high if DCT coefficients of large values appear consecutively. This problem arises not only in the coding apparatus but also in the decoding apparatus.

SUMMARY OF THE INVENTION

The present invention has been conceived in view of the above problem, and has an object to provide a coding apparatus and a decoding apparatus which allow reduction in the maximum data transmission rate.

In order to achieve the above object, the coding apparatus according to the present invention is a coding apparatus which codes data regarding a moving picture, and includes: a multivalued data advanced-coding unit which performs advanced-coding on multivalued data representing one of a quantized DCT coefficient and a motion vector, so as to reduce a bit length of binary data obtained by binarizing the multivalued data; a conversion unit which converts the advanced-coded data obtained by the multivalued data advanced-coding unit into the binary data; and an arithmetic coding unit which performs arithmetic coding on the binary data obtained by the conversion unit. With this structure, the bit length of the binary data is reduced, and thus the maximum data transmission rate can be reduced.

Here, the multivalued data advanced-coding unit may perform advanced-coding on the multivalued data so as to reduce the bit length of the binary data, when the bit length of the binary data is larger than a predetermined length. By doing so, the bit length of the binary data is reduced when it is larger than the predetermined length, and thus the maximum data transmission rate can be reduced.

The multivalued data advanced-coding unit may perform advanced-coding on the multivalued data so as to reduce the bit length of the binary data having the largest value. By doing so, the bit length of the binary data having the largest value is reduced, and thus the maximum data transmission rate can be reduced.

Furthermore, the multivalued data advanced-coding unit may include a binarization unit which binarizes the multivalued data; and an advanced-coding unit which performs advanced-coding on the binary data obtained by the binarization unit, so that the conversion unit converts the advanced-coded data obtained by the advanced-coding unit into the binary data. With this structure, when the multivalued data is binarized, the binary data is advanced-coded, and the advanced-coded data is converted into the binary data, the same effect as described above can be obtained.

More specifically, the advanced-coding unit may be structured so as to identify whether or not the bit length of the binary data obtained by the binarization unit is equal to or less than a predetermined length, to hold a value indicating the identification as an identification bit, and (i) to attach, to the binary data, the identification bit of a value indicating binary data when the bit length of the binary data is equal to or less than the predetermined length and (ii) to attach, to the multivalued data, the identification bit of a value indicating multivalued data when the bit length of the binary data is larger than the predetermined length. And the conversion unit may be structured so as to convert the advanced-coded data into the binary data (i) by obtaining a bit string from which the identification bit is excluded, when the identification bit indicating binary data is attached to the advanced-coded data obtained by the advanced-coding unit and (ii) by binarizing a bit string from which the identification bit is excluded, when the identification bit indicating multivalued data is attached to the advanced-coded data. With these structures, the bit length of the binary data can be reduced with a simple way.

It is preferable that the predetermined length be a bit length of the multivalued data. This is because the bit length of the advanced-coded data becomes larger than required when the predetermined length is larger than the bit length of the multivalued data as well as when the predetermined length is smaller than the bit length of the multivalued data.

Furthermore, the advanced-coding unit may perform advanced-coding on the binary data obtained by the binarization unit by appending a second bit string following 0 which appears first in the bit string of the binary data, to a first bit string representing the number of consecutive 1s from the beginning of the bit string of the binary data. And the conversion unit may convert the advanced-coded data obtained by the advanced-coding unit into the binary data by appending 0 and the second bit string to a sequence of as many 1s as the number of consecutive 1s represented by the first bit string. By doing so, the bit length of the binary data can be reduced with a simple way.

It is preferable that bit length of the first bit string be a minimum bit length required to represent the largest number of consecutive 1s from the beginning of the bit string of the binary data. This is because the bit length of the advanced-coded data becomes larger than required when the bit length of the first bit string is larger than the minimum required bit length.

The coding apparatus further includes a buffer, placed between the advanced-coding unit and the conversion unit, which temporarily stores data. With this structure, it is possible to avoid an overflow in the arithmetic coding process.

The coding apparatus may further includes: a first selection unit, placed in a stage previous to the buffer, which selects one of the binary data obtained by the binarization unit and the advanced-coded data obtained by the advanced-coding unit; and a second selection unit, placed in a stage previous to the arithmetic coding unit, which selects the binary data which is temporarily stored in the buffer when the first selection unit selects the binary data and selects the binary data obtained by the conversion unit when the first selection unit selects the advanced-coded data. With this structure, the advanced-coding process can be performed only when necessary, and thus the load on the advanced-coding process can be minimized.

Moreover, the binarization unit may attach, to the beginning of the binary data, a selection bit of a value indicating that binary data should be selected, the advanced-coding unit may attach, to the beginning of the advanced-coded data, the selection bit of a value indicating that advanced-coded data should be selected, and the first selection unit and the second selection unit may each select one of the binary data and the advanced-coded data by referring to the value of the selection bit. By doing so, one of the binary data and the advanced-coded data can be selected with a simple way.

The selection bit may be attached to one of each DCT coefficient, each motion vector, each macroblock, each slice and each picture. By doing so, it becomes possible to adaptively attach the selection bit in units suitable for the applications of the present invention.

Note that the DCT coefficient is coeff_abs_level_minus1 in H.264/AVC, and the binary data is Golomb-coded data.

Note that it is possible to embody the present invention not only as the above-described coding apparatus but also as a decoding apparatus. It is also possible to embody the present invention as a coding method which includes, as its respective steps, the characteristic units included in such coding apparatus, as well as a program causing a computer to execute these steps. It should be also noted that such program can be distributed on a recording medium such as a CD-ROM and via a transmission medium such as the Internet.

The functional blocks of the structure diagram (such as FIG. 3 and the like) are typically achieved in the form of an integrated circuit or a Large Scale Integrated (LSI) circuit. Each of these parts can be in plural single-function LSIs, or also can be in one integrated LSI. The name used here is LSI, but it may also be called IC, system LSI, super LSI, or ultra LSI depending on the degree of integration.

Moreover, ways to achieve integration are not limited to the LSI, and a special circuit or a general purpose processor and so forth can also achieve the integration. Field Programmable Gate Array (FPGA) that can be programmed after manufacturing LSI or a reconfigurable processor that allows re-configuration of the connection or configuration of LSI can be used for the same purpose.

In the future, with advancement in manufacturing technology, a brand-new technology may replace LSI. The integration can be carried out by that technology. Application of biotechnology is one such possibility.

As is obvious from the above description, the coding apparatus of the present invention reduces the maximum bit length of binary data, and thus allows reduction in the maximum data transmission rate. As mentioned above, by reducing the maximum data transmission rate into the bin buffer 3, the maximum bandwidth of the bin buffer 3 can be reduced.

Similarly, the decoding apparatus of the present invention reduces the maximum bit length of binary data, and thus allows reduction in the maximum data transmission rate. As mentioned above, by reducing the maximum data transmission rate into the bin buffer 3, the maximum bandwidth of the bin buffer 3 can be reduced.

FURTHER INFORMATION ABOUT TECHNICAL BACKGROUND TO THIS APPLICATION

The disclosure of Japanese Patent Application No. 2005-305786 filed on Oct. 20, 2005 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 4 is a diagram which describes a binarization process of DCT coefficients;

FIG. 5 is a diagram which shows a pseudo program for generating an UEGk suffix;

FIG. 6 is a diagram which describes an advanced-coding process in the first embodiment;

FIG. 8 is a diagram which describes an advanced-coding process in the second embodiment;

FIG. 11 is a diagram which describes a binarization process of motion vectors;

FIG. 12 is a diagram which describes an advanced-coding process in the third embodiment;

FIG. 14 is a diagram which describes an advanced-coding process in the fourth embodiment;

FIG. 17 is a diagram which shows binary coefficients and advanced-coded coefficients which are respectively appended with selection bits;

DESCRIPTION OF THE PREFERRED EMBODIMENTS

Hereafter, the embodiments of the present invention will be described in detail with reference to the drawings.

First Embodiment

Figure 1:
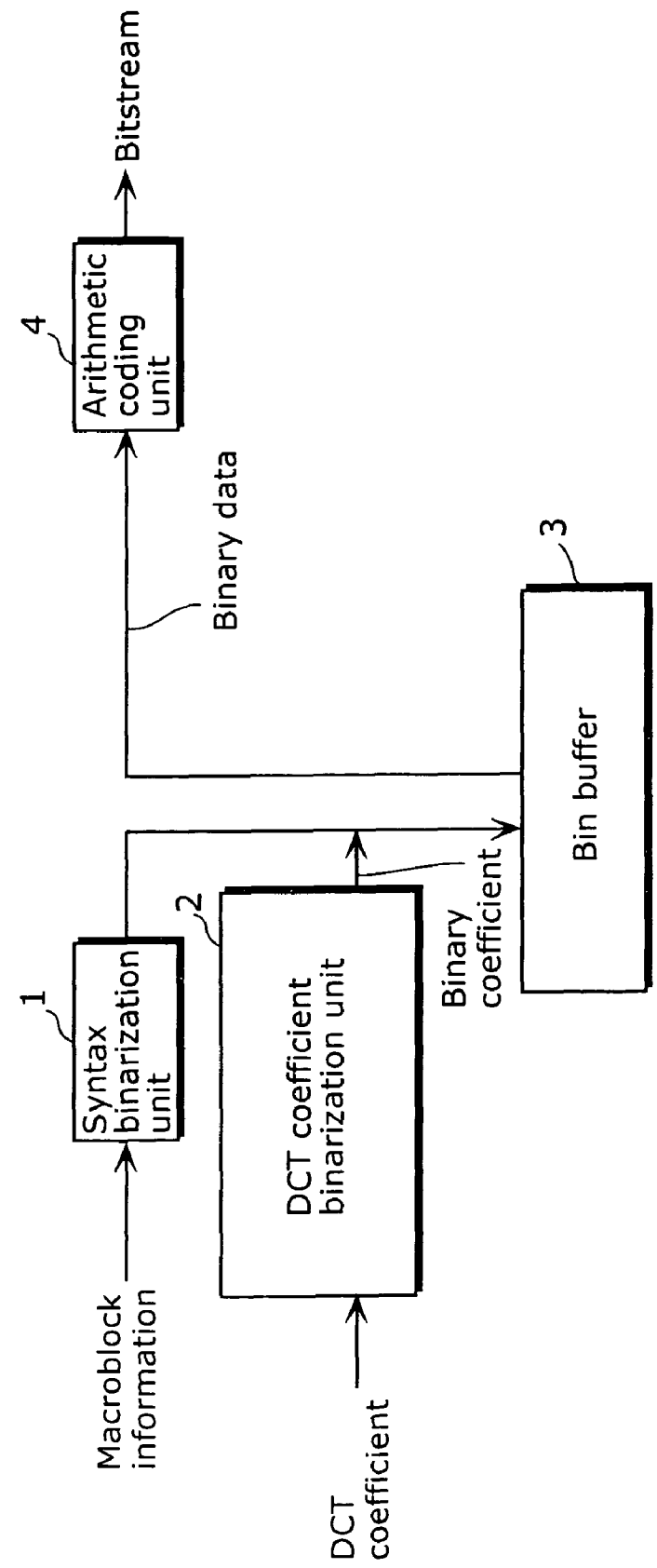
FIG. 1 is a diagram which shows a structure of a conventional coding circuit using CABAC.
Figure 2:
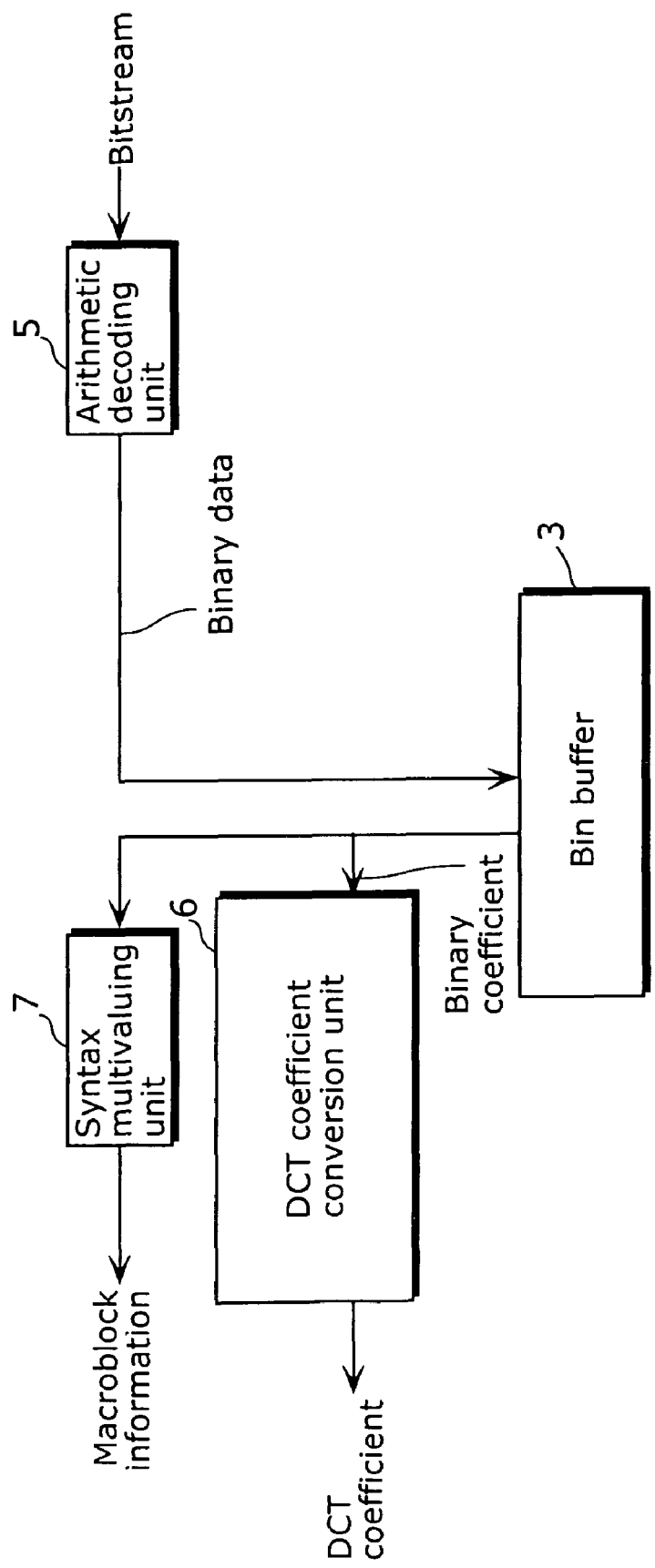
FIG. 2 is a diagram which shows a structure of a conventional decoding circuit using CABAC.
Figure 3:
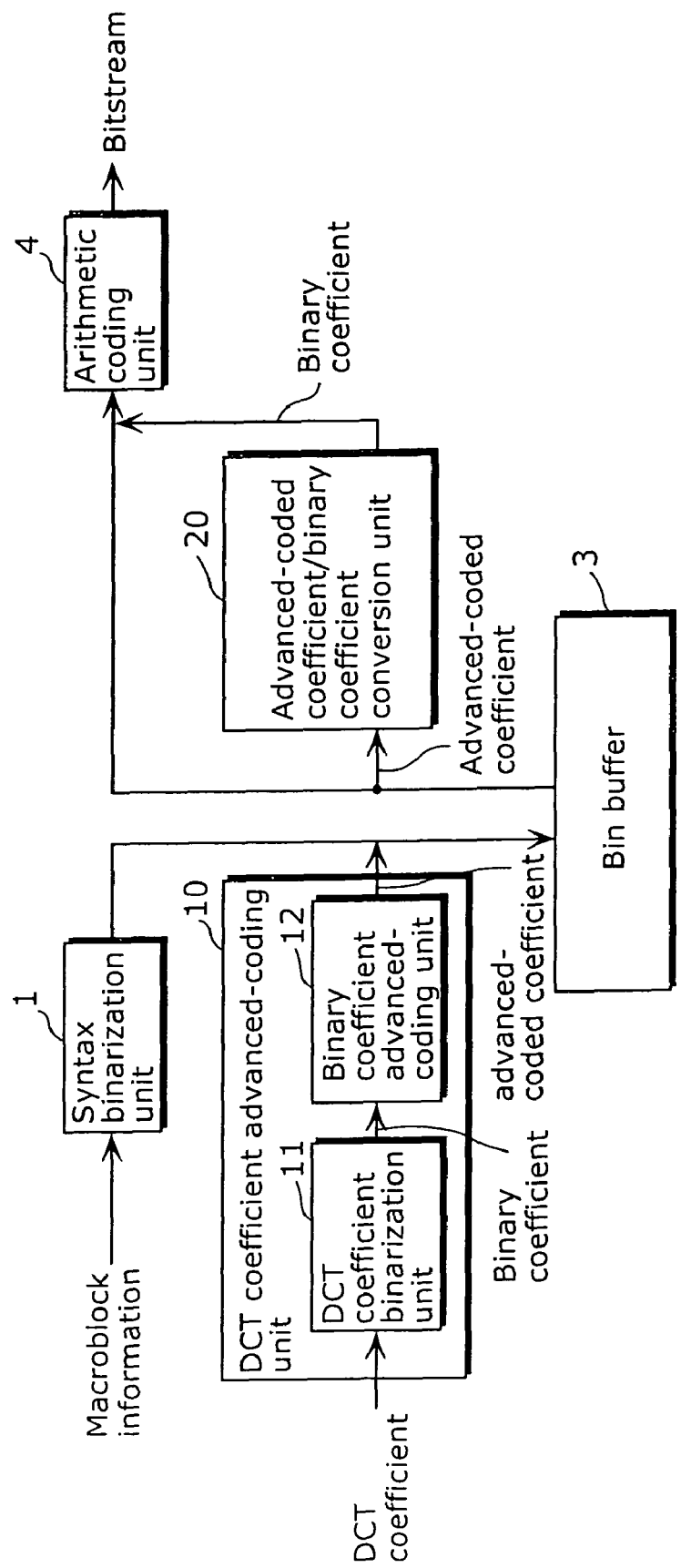
FIG. 3 is a diagram which shows a structure of a CABAC coding apparatus in the first embodiment.

FIG. 3 is a diagram which shows a structure of a CABAC coding apparatus in the first embodiment. This CABAC coding apparatus is an apparatus which codes data regarding moving pictures, and includes, in terms of function, a syntax binarization unit 1, a DCT coefficient binarization unit 11, a binary coefficient advanced-coding unit 12, a bin buffer 3, an advanced-coded coefficient/binary coefficient conversion unit 20 and an arithmetic coding unit 4.

The syntax binarization unit 1 is a binarization circuit or the like which binarizes an inputted syntax element and outputs the binarized syntax element. The DCT coefficient binarization unit 11 is a binarization circuit or the like which binarizes an inputted DCT coefficient and outputs the binarized DCT coefficient (hereinafter referred to as a binary coefficient). The binary coefficient advanced-coding unit 12 is an advanced-coding circuit or the like which represents an inputted binary coefficient as a bit string obtained through advanced-coding and outputs the coefficient represented as such advanced-coded bit string (hereinafter referred to as an advanced-coded coefficient). The bin buffer 3 is a RAM or the like which temporarily stores data such as advanced-coded coefficients and the like. The advanced-coded coefficient/binary coefficient conversion unit 20 is a conversion circuit or the like which converts an inputted advanced-coded coefficient into an original binary coefficient and outputs the resulting data. The arithmetic coding unit 4 is an arithmetic coding circuit or the like which performs arithmetic coding on an inputted binary coefficient and outputs the resulting data.

FIG. 4 is a diagram which describes a binarization process of DCT coefficients (coeff_abs_level_minus1).

As already described above, in CABAC, UEGk coding is employed as a binarization method. UEGk is a concatenation of truncated unary (TU) coding and Exp-Golomb coding, and has three parameters k, signedValFlag and uCoff.

TU coding is employed to represent the first half (UEGk prefix) of a bit string of binarized data. The parameter uCoff indicates the largest value of the number to be TU-coded. When the original code value (DCT coefficient value) is less than the parameter uCoff, the bit string is represented as a sequence of as many 1s as the original code value appended with 0, whereas when the original code value is equal to or larger than uCoff, the bit string is represented as a sequence of as many 1s as the value of uCoff.

Exp-Golomb coding is employed to represent the latter half (UEGk suffix) of the bit string of binarized data. For simplicity, UEGk suffix is separated into Prefix, Separator, Suffix and Sign. Assuming that the original code value is synElVal, UEGk suffix is generated by a pseudo program as shown in FIG. 5.

For DCT coefficients (coeff_abs_level_minus1), UEG0, signedValFlag=0 and uCoff=14 are used. "UEG0" indicates that the above-mentioned parameter k is 0. "signedValFlag=0" indicates that a bit indicating the polarity is not appended. "uCoff=14" indicates that the largest value of TU is 14.

Therefore, the first half (UEG0 prefix) of the bit string is represented as a sequence of as many 1s as the original code value appended with 0 when the original code value is less than fourteen (14), whereas it is represented as a sequence of fourteen 1s when the original value is equal to or larger than 14. As for the latter half (UEG0) of the bit string, it is represented just as the sequence of UEG0 prefix without UEG0 suffix appended, when the original value is less than 14. Note that since Exp-Golomb coding is performed as shown in the pseudo program (see FIG. 5), a detailed description is not given here.

FIG. 6 is a diagram which describes an advanced-coding process in the first embodiment.

As described above, a DCT coefficient (coeff_abs_level_minus1) is 17-bit data. Therefore, in the present embodiment, an advanced-coding method is changed between a binary coefficient of 17 or smaller bits and a binary coefficient of greater than 17 bits.

To be more specific, when the value of a DCT coefficient is 16 or less, the bit length of its binary coefficient value is 17 bits or less. In this case, the advanced-coded coefficient is represented as a bit string of an identification bit "0" and the following binary numbers which represent the binary coefficient. For example, when the value of a DCT coefficient is 16, its binary coefficient value is represented as "11111111111111101", and thus its advanced-coded coefficient value is represented as "011111111111111101" which is a concatenation of the identification bit "0" and the following bit string of the binary coefficient "11111111111111101".

On the other hand, when the value of a DCT coefficient is larger than 16, the bit length of its binary coefficient is greater than 17 bits. In this case, the advanced-coded coefficient is represented as a bit string of an identification bit "1" and the following binary numbers which represent the DCT coefficient. For example, when the value of a DCT coefficient is 17, this DCT coefficient is represented as "00000000000010001", and therefore its advanced-coded coefficient value is represented as "100000000000010001" which is a concatenation of the identification bit "1" and the following bit string "00000000000010001".

Note that in FIG. 3, data inputted to the binary coefficient advanced-coding unit 12 is a binary coefficient outputted from the DCT coefficient binarization unit 11, and thus this binary coefficient needs to be multivalued in order to use the DCT coefficient value represented as "00000000000010001" in the advanced-coding process as described above, although the present embodiment may be configured so that the original non-binary DCT coefficient value is directly converted to an advanced-coded representation without binarization process. This configuration will be described later.

Figure 7:
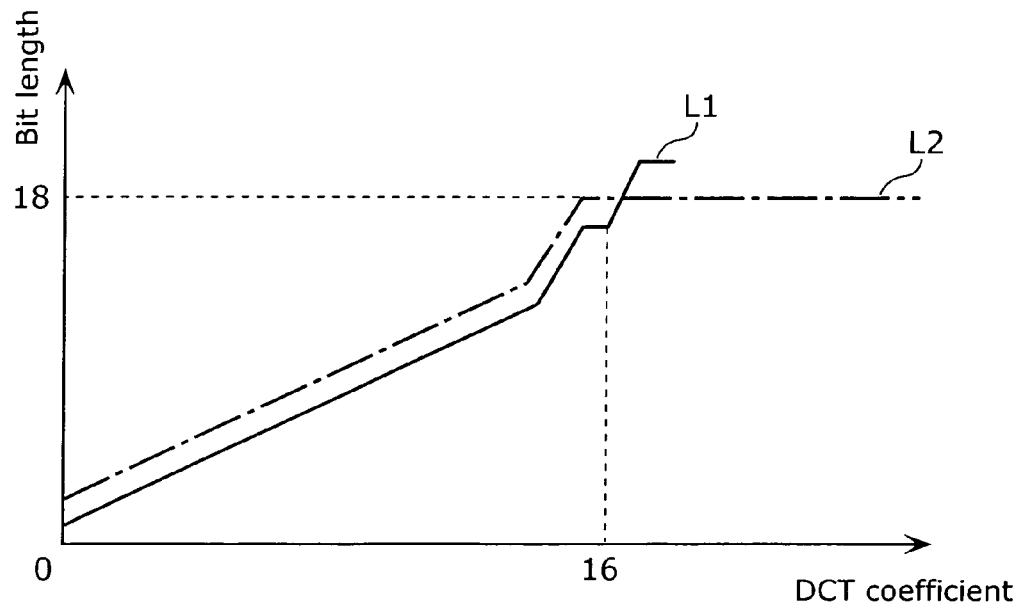
FIG. 7 is a diagram which describes the effect of the advanced-coding process in the first embodiment.

FIG. 7 is a diagram which describes the effect of the advanced-coding process in the first embodiment. This diagram shows how the bit length of a binary coefficient and the bit length of an advanced-coded coefficient change as the DCT coefficient value increases. The change in bit length of a binary coefficient is indicated in a full line as a waveform L1, whereas the change in bit length of an advanced-coded coefficient is indicated by a dashed line as a waveform L2.

As shown in this diagram, when the value of a DCT coefficient is 16 or less, the bit length of a binary coefficient is smaller than the bit length of an advanced-coded coefficient. On the contrary, when the value of a DCT coefficient is larger than 16, the bit length of an advanced-coded coefficient is smaller than the bit length of a binary coefficient.

Binarization of the largest DCT coefficient value results in data of 49 bits, whereas the corresponding advanced-coded coefficient has only 18 bits. In other words, since the bit length of an advanced-coded coefficient is 18 bits at most, the advanced-coding process in the first embodiment allows reduction in the maximum data transmission rate into the bin buffer 3.

The advanced-coded coefficient generated as such is temporarily stored into the bin buffer 3, and then inputted into the advanced-coded coefficient/binary coefficient conversion unit 20. Upon receiving the advanced-coded coefficient, the advanced-coded coefficient/binary coefficient conversion unit 20 performs the following process depending on the value of the identification bit attached to the beginning of the bit string of the advanced-coded coefficient.

To be more specific, when the value of the identification bit is "0", the advanced-coded coefficient/binary coefficient conversion unit 20 outputs, to the arithmetic coding unit 4, the bit string from which the identification bit "0" is excluded. For example, when the value of a advanced-coded coefficient is "011111111111111101", the advanced-coded coefficient/binary coefficient conversion unit 20 outputs, to the arithmetic coding unit 4, the bit string from which the identification bit "0" is excluded, that is, "11111111111111101". This bit string "11111111111111101" is equal to the bit string of the binary coefficient which corresponds to the DCT coefficient of the value 16.

On the other hand, when the value of the identification bit is "1", the advanced-coded coefficient/binary coefficient conversion unit 20 binarizes the bit string from which the identification bit "1" is excluded, and then outputs the binarized coefficient to the arithmetic coding unit 4. For example, when the value of an advanced-coded coefficient is "100000000000010001", the advanced-coded coefficient/binary coefficient conversion unit 20 binarizes the bit string from which the identification bit "1" is excluded, that is, "00000000000010001", and then outputs its binarized coefficient "11111111111111000" to the arithmetic coding unit 4. This bit string "11111111111111000" is equal to the bit string of the binary coefficient which corresponds to the DCT coefficient of the value 17.

As a result, the binary coefficient is inputted to the arithmetic coding unit 4, which codes and outputs the inputted bit string of the binary coefficient bit by bit. Since this arithmetic coding process is same as the conventional one, the description thereof is not repeated here.

As described above, according to the first embodiment, since the maximum bit length of a binary coefficient is reduced, the maximum data transmission rate can also be reduced. As mentioned above, by reducing the maximum data transmission rate to the bin buffer 3, the maximum bandwidth of the bin buffer 3 can be reduced.

Note that in the present embodiment, an advanced-coding method is changed between a binary coefficient of 17 or smaller bits and a binary coefficient of greater than 17 bits, but the boundary of the change in the advanced-coding method is not limited to 17 bits. However, since a DCT coefficient is 17-bit data, it is preferable to set the boundary of the change in the advanced-coding method to 17 bits. This is because if the boundary is set to a greater value than 17 bits, or a smaller value than 17 bits, the bit length of an advanced-coded coefficient may be larger than required.

One of the above two methods, that is, the advanced-coding method adopted only for the case where the bit length of a binary coefficient is greater than 17 bits, in which a DCT coefficient value before binarization is used for advanced-coding, may be adopted for all the DCT coefficients. If this method is adopted, since the maximum bit length of the advanced-coded coefficients is 17 bits, at least the object to reduce the maximum data transmission rate into the bin buffer 3 can be achieved.

In addition, although the present embodiment shows, as an example, the structure in which a structural unit for binarizing a DCT coefficient and a structural unit for advanced-coding a binary coefficient are provided separately, the present invention is not limited to such structure. In other words, the same effect can be obtained even if an advanced-coded coefficient is derived directly from a DCT coefficient based on the judgment of the value of the DCT coefficient. As described above, the structural unit which performs both the binarization process and the advanced-coding process is hereinafter referred to as a "DCT coefficient advanced-coding unit 10". This DCT coefficient advanced-coding unit 10 derives an advanced-coded coefficient directly from a DCT coefficient, as mentioned above, without outputting the bit string obtained through binarization of the DCT coefficient.

Since the present invention does not aim at the process to be performed on macroblock information, a detailed description is not given here. However, there is no particular limitation to a method for distinguishing between the information within the scope of the present invention and the information outside the scope, among various types of information included in a syntax. For example, as shown in FIG. 3, the present invention may be applied to separate processing methods for the information within the scope of the present invention and the information outside the scope, or may be selectively applied to only one processing method. In the case where the present invention is selectively applied to the only one method, a syntax element distinction unit needs to be provided in the apparatus to distinguish between the information within the scope of the present invention and the information outside that scope.

Second Embodiment

In the second embodiment, an advanced-coding method which is different from that of the first embodiment is adopted. To be more specific, the present invention is not limited to any particular advanced-coding method as long as such method allows conversion of binary data of a DCT coefficient or a motion vector into advanced-coded data having a smaller bit length. The following describes the advanced-coding method in the second embodiment by focusing on the differences from the first embodiment.

FIG. 8 is a diagram which describes an advanced-coding process in the second embodiment.

When the original code value x of a DCT coefficient (coef_f_abs_level_minus1) is less than 14, the binary data of the DCT coefficient is represented as a sequence of as many 1s as the value of x appended with 0, whereas when the original code value 1s equal to or larger than 14, the binary data is represented as a sequence of 14+Ceil(log2(x−13)) 1s. The maximum number of consecutive 1s in the bit string is 30.

In the second embodiment, an advanced-coding method using such characteristic of binary data is adopted. To be more specific, the binary coefficient advanced-coding unit 12 appends a bit string (hereinafter referred to as a "second bit string") following the first 0 in the bit string of a binary coefficient, to a 5-bit string (hereinafter referred to as a "first bit string") indicating the number of consecutive 1s from the beginning of the bit string of the binary coefficient.

For example, when the value of a DCT coefficient is 14, the bit string of its binary coefficient is "1111111111111110". Since the number of consecutive 1s from the beginning of this bit string is 14, the first bit string "01110" is obtained by representing 14 as a binary number. On the other hand, since only one 0 appears at the end of this bit string "1111111111111110", the second bit string does not exist. Therefore, "01110" is obtained as an advanced-coded coefficient.

When the value of a DCT coefficient is 15, the bit string of its binary coefficient is "11111111111111100". Since the number of consecutive 1s from the beginning of this bit string is 15, the first bit string "01111" is obtained by representing 15 as a binary number. On the other hand, since the bit string which follows the first 0 in this bit string "11111111111111100" is "0", the second bit string is this "0". Therefore, "011110" which is the first bit string "01111" appended with the second bit string "0" is obtained as an advanced-coded coefficient.

Figure 9:
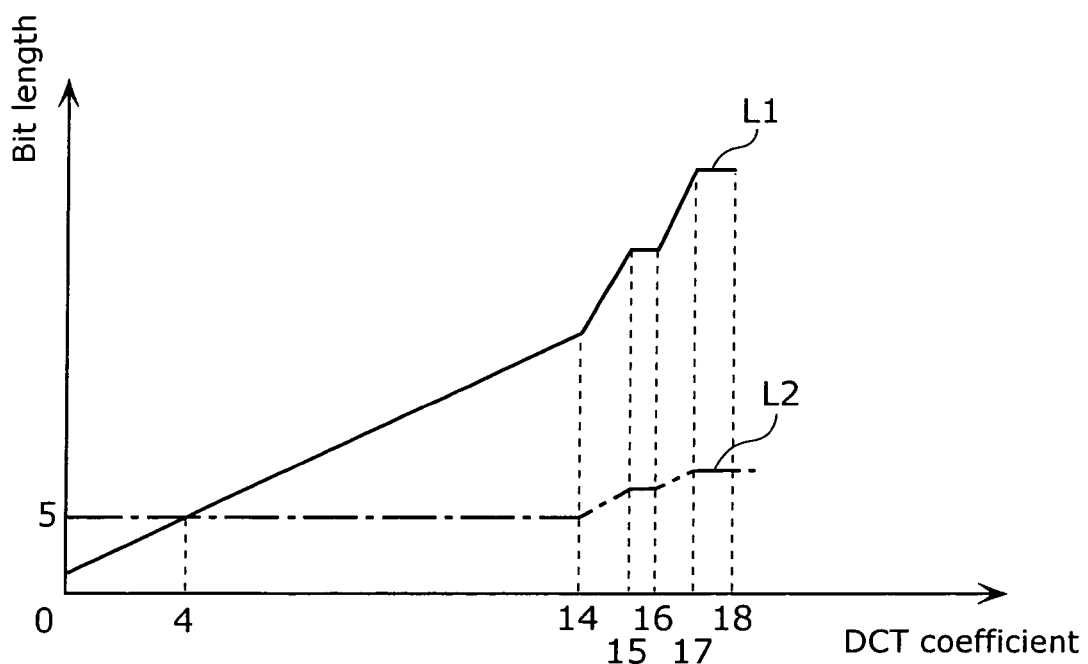
FIG. 9 is a diagram which describes the effect of the advanced-coding process in the second embodiment.

FIG. 9 is a diagram which describes the effect of the advanced-coding process in the second embodiment. The change in bit length of a binary coefficient is indicated in a full line as a waveform L1, whereas the change in bit length of an advanced-coded coefficient is indicated by a dashed line as a waveform L2, as in FIG. 7.

As shown in this diagram, when the value of a DCT coefficient is less than 4, the bit length of a binary coefficient is smaller than the bit length of an advanced-coded coefficient. On the contrary, when the value of a DCT coefficient is larger than 4, the bit length of an advanced-coded coefficient is smaller than the bit length of a binary coefficient. Note that when the value of a DCT coefficient is 4, the bit length of a binary coefficient is equal to that of an advanced-coded coefficient.

The advanced-coded coefficient generated as such is temporarily stored into the bin buffer 3, and then inputted into the advanced-coded coefficient/binary coefficient conversion unit 20. Upon receiving the advanced-coded coefficient, the advanced-coded coefficient/binary coefficient conversion unit 20 appends 0 and the second bit string to the sequence of as many 1s as the value indicated by the first bit string of the advanced-coded coefficient.

For example, when an advanced-coded coefficient value is "01110", a sequence of as many 1s as the value indicated by the first five bits (first bit string) is obtained. Since the first bit string "01110" corresponds to 14 in decimal representation, a bit string "11111111111111" is obtained. Then, 0 and the second bit string are appended to this bit string "1111111111111". Since the second bit string (sixth and the following bits of the advanced-coded coefficient) does not exist in this case, a bit string "111111111111110", that is, the bit string "11111111111111" appended with only "0", is outputted to the arithmetic coding unit 4. This bit string "111111111111110" is equal to the bit string of the binary coefficient which corresponds to the DCT coefficient of the value 14.

When an advanced-coded coefficient value is "011110", a sequence of as many 1s as the value indicated by the first five bits (first bit string) is obtained. Since the first bit string "01111" corresponds to 15 in decimal representation, a bit string "111111111111111" is obtained in this case. Then, 0 and the second bit string are appended to this bit string "1111111111111111". Since the second bit string (sixth and the following bits of the advanced-coded coefficient) is "0" in this case, a bit string "1111111111111100", that is, the bit string "11111111111111" appended with "00", is outputted to the arithmetic coding unit 4. This bit string "1111111111111100" is equal to the bit string of the binary coefficient which corresponds to the DCT coefficient of the value 15.

With this structure of the second embodiment, since the maximum bit length of a binary coefficient is reduced, it is possible to reduce the maximum data transmission rate. As mentioned above, by reducing the maximum data transmission rate to the bin buffer 3, the maximum bandwidth of the bin buffer 3 can be reduced.

Note that the bit length of the first bit string is 5 bits in the present embodiment, but the present invention is not limited to this length. In other words, the first bit string needs only have a bit length required for representing the largest number of consecutive 1s in a binary coefficient value. However, in order to reduce the bit length of an advanced-coded coefficient, it is preferable to adopt the minimum bit length out of the bit lengths required for representing the above largest value.

Third Embodiment

The first and second embodiments describe the case where a binarized DCT coefficient is converted into an advanced-coded coefficient. But elements to be advanced-coded are not limited to DCT coefficients. In other words, the present invention can be applied to any data as long as it is the data regarding moving pictures.

The following describes a method for converting a binarized motion vector into advanced-coded data, by focusing on the differences from the first embodiment. Note that hereinafter a binarized motion vector is referred to as a "binary vector", and a binary vector represented as an advanced-coded bit string is referred to as an "advanced-coded vector".

Figure 10:
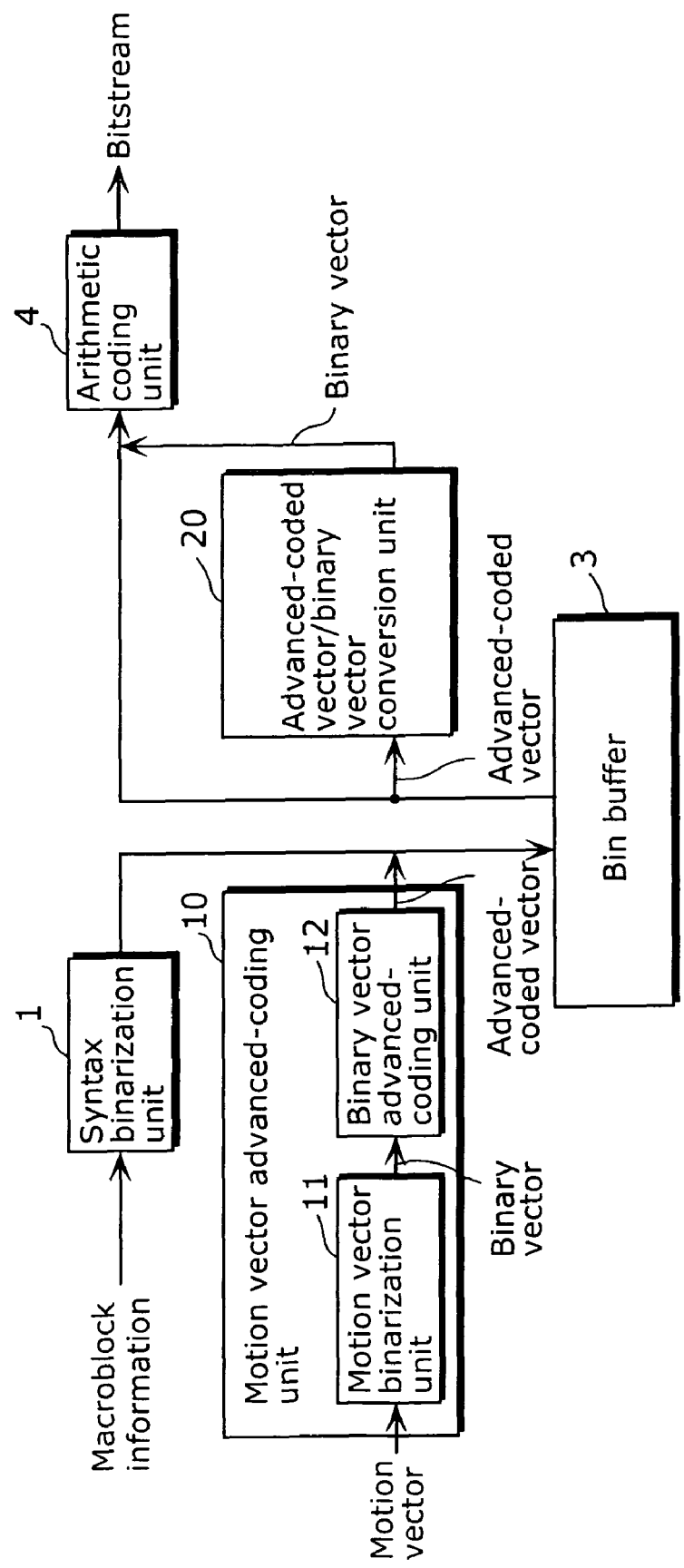
FIG. 10 is a diagram which shows a structure of a CABAC coding apparatus in the third embodiment.

FIG. 10 is a diagram which shows a structure of a CABAC coding apparatus in the third embodiment. This CABAC coding apparatus includes a syntax binarization unit 1, a motion vector binarization unit 11, a binary vector advanced-coding unit 12, a bin buffer 3, an advanced-coded vector/binary vector conversion unit 20 and an arithmetic coding unit 4. The function of each unit is same as that in the first embodiment, except that a motion vector, in place of a DCT coefficient, is to be advanced-coded.

FIG. 11 is a diagram which describes a binarization process of motion vectors (mvd_l0, mvd_l1).

For motion vectors (mvd_l0, mvd_l1), UEG3, signedValFlag=1 and uCoff=9 are used. "UEG3" indicates that the above-mentioned parameter k is 3. "signedValFlag=1" indicates that a bit indicating the polarity is appended to a bit string. "uCoff=9" indicates that the largest value of TU is 9.

TU coding is employed for the first half (UEG3 prefix) of a sequence of binary code bits. When the absolute value of an original code value (motion vector value) is less than 8, the first half of the sequence is represented as a sequence of as many 1s as the original code value appended with 0, whereas when the absolute value of an original code value is equal to or larger than nine (9), it is represented as a sequence of nine 1s.

Exp-Golomb coding is employed for the latter half (UEG3 suffix) of a sequence of binary code bits. As for the latter half of the sequence, it is represented just as the sequence of UEG3 prefix without UEG3 suffix appended, when the absolute value of an original code value is 8 or less. Note that since Exp-Golomb coding is performed as shown in the pseudo program (see FIG. 5), a detailed description is not given here.

FIG. 12 is a diagram which describes an advanced-coding process in the third embodiment.

Motion vectors (mvd_l0, mvd_l1) are 14-bit data. Therefore, in the present embodiment, an advanced-coding method is changed between a binary vector of 14 or smaller bits and a binary vector of larger than 14 bits.

To be more specific, when the absolute value of a motion vector is 16 or less, the bit length of the binary vector is 14 bits or less. In this case, the advanced-coded vector is a bit string of an identification bit "0" and the following binary numbers which represent the binary vector. For example, when the value of a motion vector is −16, the binary vector is represented as "11111111101111", and thus the advanced-coded vector is represented as "011111111101111" which is a concatenation of the identification bit "0" and the following bit string of the binary coefficient "11111111101111".

On the other hand, when the absolute value of a motion vector is larger than 16, the bit length of the binary vector is greater than 14 bits. In this case, the advanced-coded vector is a bit string of an identification bit "1" and the following binary numbers which represent the motion vector. For example, when the value of a motion vector is 17, this motion vector is represented as "00000000010001", and thus the advanced-coded vector is represented as "100000000010001" which is a concatenation of the identification bit "1" and the following bit string "00000000010001".

Figure 13:
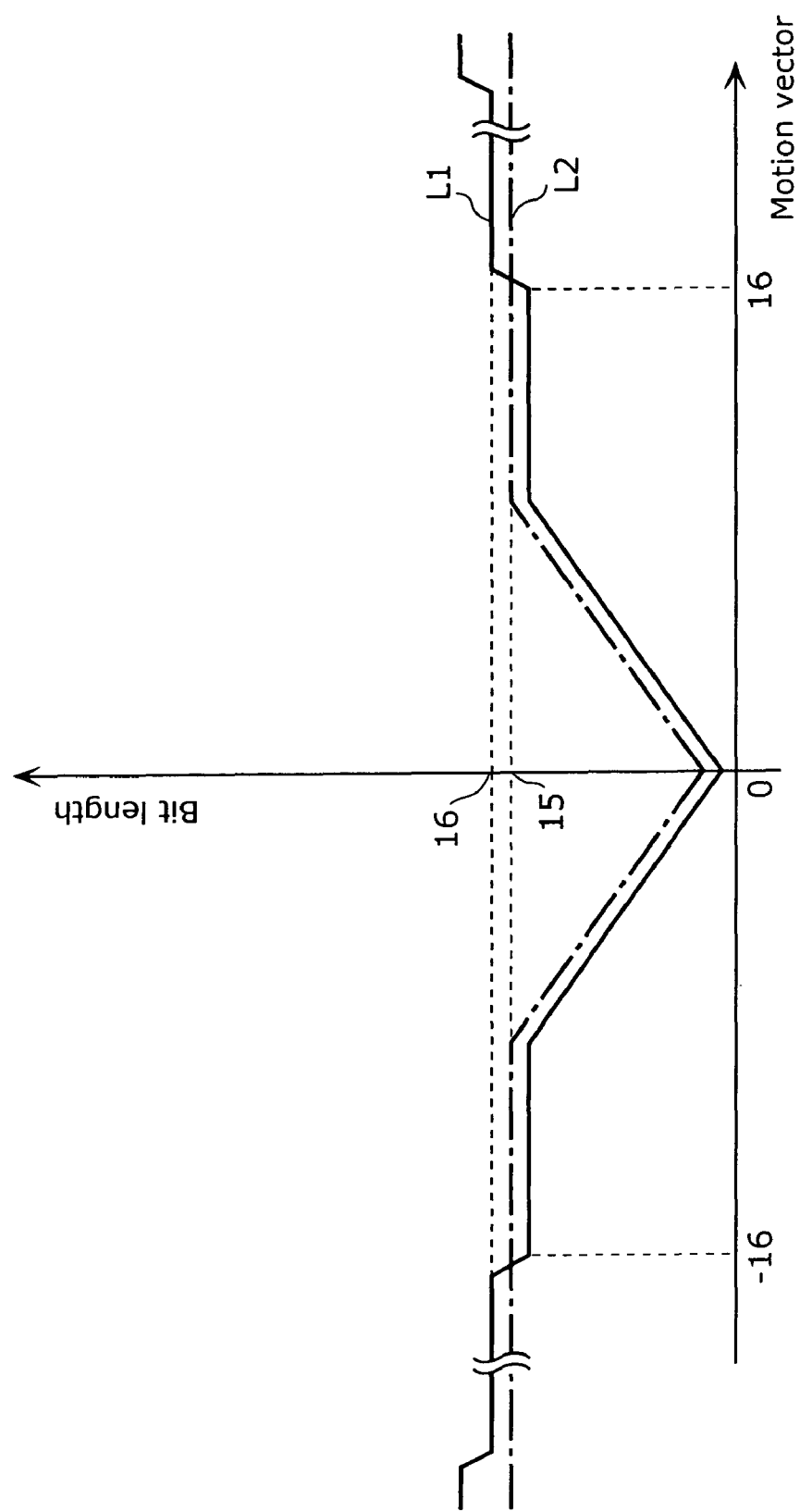
FIG. 13 is a diagram which describes the effect of the advanced-coding process in the third embodiment.

FIG. 13 is a diagram which describes the effect of the advanced-coding process in the third embodiment. This diagram shows how the bit length of a binary vector and the bit length of an advanced-coded vector change as the absolute value of the motion vector increases. The change in bit length of a binary vector is indicated in a full line as a waveform L1, whereas the change in bit length of an advanced-coded vector is indicated by a dashed line as a waveform L2.

As shown in this diagram, when the absolute value of a motion vector is 16 or less, the bit length of a binary vector is smaller than the bit length of an advanced-coded vector. On the other hand, when the absolute value of a motion vector is larger than 16, the bit length of an advanced-coded vector is smaller than the bit length of a binary vector. Since the bit length of an advanced-coded vector is 15 bits at most, the advanced-coding process in the third embodiment allows reduction in the maximum data transmission rate into the bin buffer 3.

The advanced-coded vector generated as such is temporarily stored into the bin buffer 3, and then inputted into the advanced-coded vector/binary vector conversion unit 20. Upon receiving the advanced-coded vector, the advanced-coded vector/binary vector conversion unit 20 performs the following process depending on the value of the identification bit attached to the beginning of the bit string of the advanced-coded vector.

To be more specific, when the value of the identification bit is "0", the advanced-coded vector/binary vector conversion unit 20 outputs, to the arithmetic coding unit 4, the bit string from which the identification bit "0" is excluded. For example, when an advanced-coded vector is represented as "011111111101111", the advanced-coded vector/binary vector conversion unit 20 outputs, to the arithmetic coding unit 4, the bit string from which the identification bit "0" is excluded, that is, "11111111101111". This bit string "11111111101111" is equal to the bit string of the binary vector which corresponds to the motion vector of the value −16.

On the other hand, when the value of the identification bit is "1", the advanced-coded vector/binary vector conversion unit 20 binarizes the bit string from which the identification bit "1" is excluded, and then outputs the binarized vector to the arithmetic coding unit 4. For example, when an advanced-coded vector is represented as "100000000010001", the advanced-coded vector/binary vector conversion unit 20 binarizes the bit string from which the identification bit "1" is excluded, that is, "00000000010001", and then outputs the binarized vector "11111111101111" to the arithmetic coding unit 4. This bit string "11111111101111" is equal to the bit string of the binary vector which corresponds to the motion vector of the value 17.

As described above, according to the third embodiment, since the maximum bit length of a binary vector is reduced, the maximum data transmission rate can also be reduced. As mentioned above, by reducing the maximum data transmission rate to the bin buffer 3, the maximum bandwidth of the bin buffer 3 can be reduced.

Note that in the present embodiment, an advanced-coding method is changed between a binary vector of 14 or smaller bits and a binary vector of greater than 14 bits, but the boundary of the change in the advanced-coding method is not limited to 14 bits. However, since a motion vector is 14-bit data, it is preferable to set the boundary of the change in the advanced-coding method to 14 bits.

One of the above two methods, that is, the advanced-coding method adopted for the case where the bit length of a binary vector is greater than 14 bits, in which the bit string representing only a motion vector before binarization is stored in the bin buffer, may be adopted for all the motion vectors. If this method is adopted, since the maximum bit length of the advanced-coded motion vectors is 14 bits, at least the object to reduce the maximum data transmission rate into the bin buffer 3 can be achieved.

Fourth Embodiment

The fourth embodiment describes the case where the advanced-coding method of the second embodiment is applied to motion vectors. The following describes the fourth embodiment by focusing on the differences from the second embodiment.

FIG. 14 is a diagram which describes an advanced-coding process in the fourth embodiment.

The binary vector advanced-coding unit 12 appends a bit string (hereinafter referred to as a "second bit string") following the first 0 in the bit string of a binary vector, to a 5-bit string (hereinafter referred to as a "first bit string") indicating the number of consecutive 1s from the beginning of the bit string of the binary vector.

For example, when the value of a motion vector is −16, the bit string of the binary vector is "11111111101111". Since the number of consecutive 1s from the beginning of this bit string is 9, the first bit string "01001" is obtained by representing 9 as a binary number. On the other hand, since the bit string which follows the first 0 in this bit string "11111111101111" is "1111", the second bit string is this "1111". Therefore, "010011111" which is a concatenation of the first bit string "01001" and the following second bit string "1111" is obtained as an advanced-coded vector.

When the value of a motion vector is 17, the bit string of the binary vector is "1111111111000000". Since the number of consecutive 1s from the beginning of this bit string is 10, the first bit string "01010" is obtained by representing 10 as a binary number. On the other hand, since the bit string which follows the first 0 in this bit string "1111111111000000" is "00000", the second bit string is this "00000". Therefore, "0101000000" which is a concatenation of the first bit string "01010" and the following second bit string "00000" is obtained as an advanced-coded vector.

Figure 15:
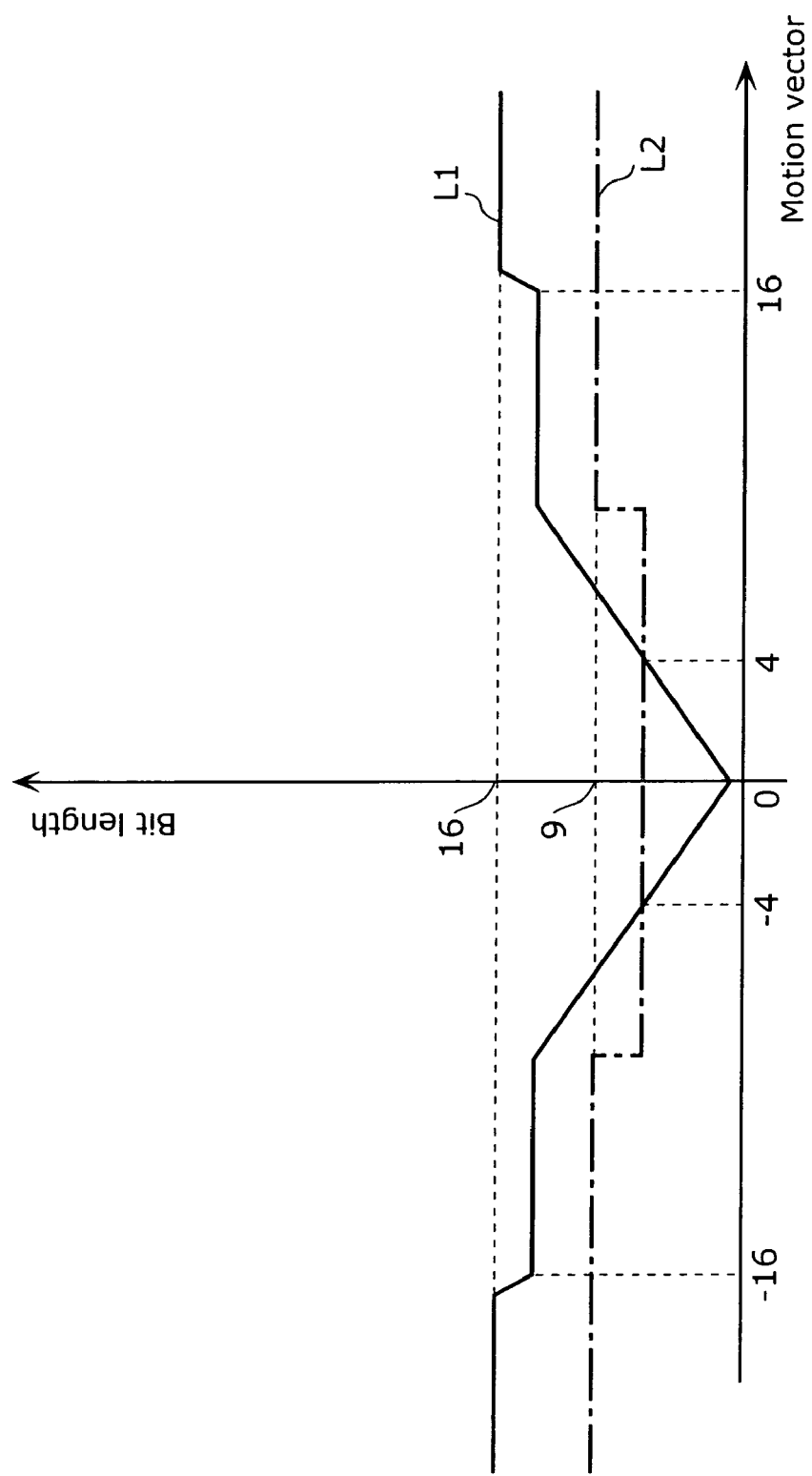
FIG. 15 is a diagram which describes the effect of the advanced-coding process in the fourth embodiment.

FIG. 15 is a diagram which describes the effect of the advanced-coding process in the fourth embodiment. The change in bit length of a binary vector is indicated in a full line as a waveform L1, whereas the change in bit length of an advanced-coded vector is indicated by a dashed line as a waveform L2, as in FIG. 9.

As shown in this diagram, when the absolute value of a motion vector is less than 4, the bit length of a binary vector is smaller than the bit length of an advanced-coded vector. On the other hand, when the absolute value of a motion vector is larger than 4, the bit length of an advanced-coded vector is smaller than the bit length of a binary vector. Note that when the absolute value of a motion vector is 4, the bit length of a binary vector is equal to that of an advanced-coded vector.

The advanced-coded vector generated as such is temporarily stored into the bin buffer 3, and then inputted into the advanced-coded vector/binary vector conversion unit 20. Upon receiving the advanced-coded vector, the advanced-coded vector/binary vector conversion unit 20 appends 0 and the second bit string to the sequence of as many 1s as the value indicated by the first bit string of the advanced-coded vector.

For example, when an advanced-coded vector is "010011111", a sequence of as many 1s as the value indicated by the first five bits (first bit string) is obtained. Since the first bit string "01001" corresponds to 9 in decimal representation, a bit string "111111111" is obtained. Then, 0 and the second bit string are appended to this bit string "111111111". Since the second bit string (sixth and the following bits of the advanced-coded vector) is "1111" in this case, a bit string "11111111101111", which is a concatenation of the bit string "111111111" and the following "01111", is outputted to the arithmetic coding unit 4. This bit string "11111111101111" is equal to the bit string of the binary vector which corresponds to the motion vector of the value −16.

When an advanced-coded vector is "0101000000", a sequence of as many 1s as the value indicated by the first five bits (first bit string) is obtained. Since the first bit string "01010" corresponds to 10 in decimal representation, a bit string "1111111111" is obtained. Then, 0 and the second bit string are appended to this bit string "1111111111". Since the second bit string (sixth and the following bits of the advanced-coded vector) is "00000" in this case, a bit string "1111111111000000", which is a concatenation of the bit string "1111111111" and the following "000000", is outputted to the arithmetic coding unit 4. This bit string "1111111111000000" is equal to the bit string of the binary vector which corresponds to the motion vector of the value 17.

As described above, according to the fourth embodiment, since the maximum bit length of a binary vector is reduced, the maximum data transmission rate can also be reduced. As mentioned above, by reducing the maximum data transmission rate to the bin buffer 3, the maximum bandwidth of the bin buffer 3 can be reduced.

Note that the bit length of the first bit string is 5 bits in the present embodiment, but the present invention is not limited to this length. In other words, the first bit string needs only have a bit length required for representing the largest number of consecutive 1s in a binary vector value. However, in order to reduce the bit length of an advanced-coded vector, it is preferable to adopt the minimum bit length out of the bit lengths required for representing the above largest value.

Fifth Embodiment

In the first to fourth embodiments, binary data is to be advanced-coded, but the present invention is not limited to this case. For example, the present invention may be configured so that when an image to be coded is complicated, its binary data is advanced-coded because the bit length of the binary data is large, whereas when an image to be coded is not complicated, its binary data is not advanced-coded but directly stored into the bin buffer 3 because the bit length of the binary data is small.

Figure 16:
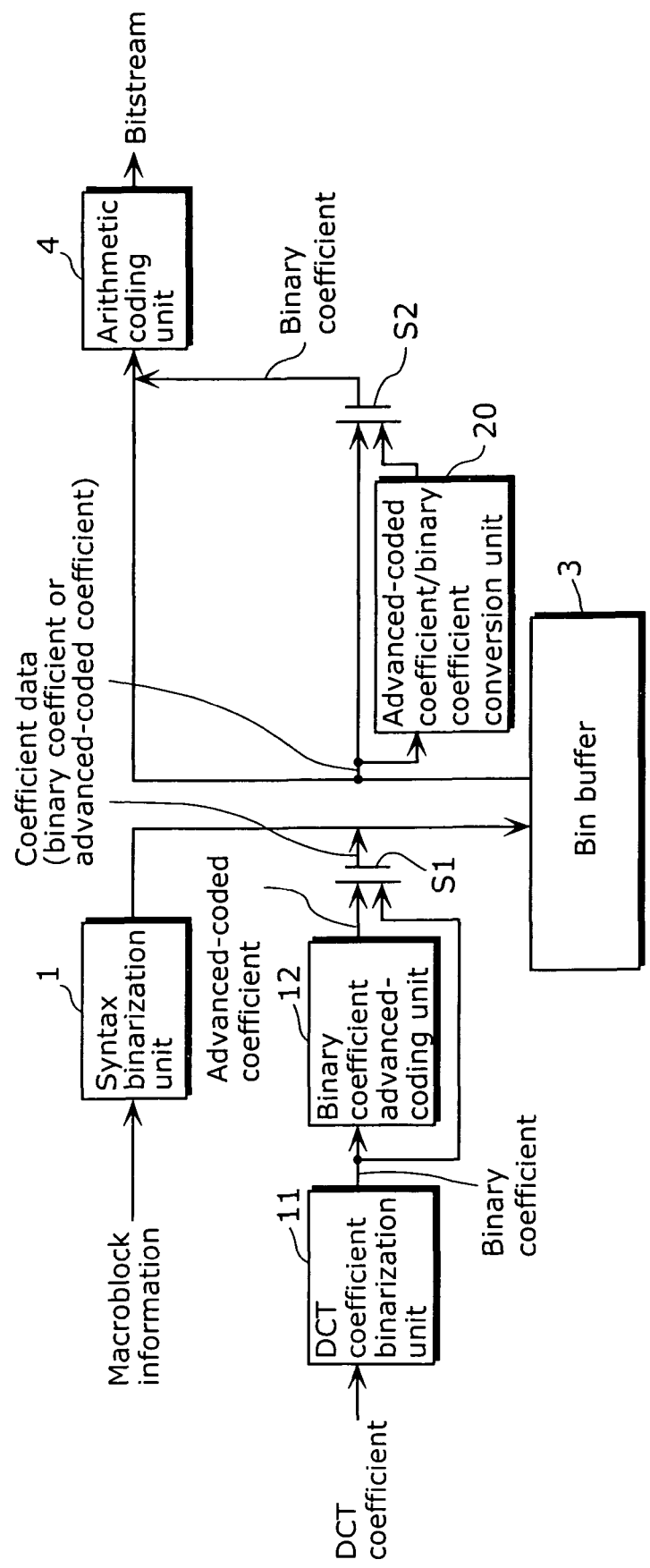
FIG. 16 is a diagram which shows a structure of a CABAC coding apparatus in the fifth embodiment.

FIG. 16 is a diagram which shows a structure of a CABAC coding apparatus in the fifth embodiment. This CABAC coding apparatus includes a syntax binarization unit 1, a DCT coefficient binarization unit 11, a binary coefficient advanced-coding unit 12, a first selection unit S1, a bin buffer 3, an advanced-coded coefficient/binary coefficient conversion unit 20, a second selection unit S2, and an arithmetic coding unit 4.

The first selection unit S1 is a selector or the like which selects one of binary data obtained by the DCT coefficient binarization unit 11 and advanced-coded data obtained by the binary coefficient advanced-coding unit 12, and outputs the selected data to the bin buffer 3. The second selection unit S2 is a selector or the like which outputs coefficient data which is temporarily stored in the bin buffer 3 directly to the arithmetic coding unit 4, when the first selection unit S1 selects binary data, whereas it selects binary data obtained by the advanced-coded coefficient/binary coefficient conversion unit 20 and outputs the selected binary data to the arithmetic coding unit 4, when the first selection unit S1 selects advanced-coded data. A method for recognizing which data has been selected by the first selection unit S1, binary data or advanced-coded data, is not particularly limited, but the present embodiment employs the following method in which a selection bit is attached to binary data and advanced-coded data.

FIG. 17 is a diagram which shows binary coefficients and advanced-coded coefficients which are respectively attached with selection bits.

The DCT coefficient binarization unit 11 attaches a selection bit "0" to the beginning of a bit string of a binary coefficient, and the binary coefficient advanced-coding unit 12 attaches a selection bit "1" to the beginning of a bit string of an advanced-coded coefficient. By doing so, the first selection unit S1 selects a bit string starting from "0" when it needs to select a binary coefficient, whereas it selects a bit string starting from "1" when it needs to select an advanced-coded coefficient. The second selection unit S2 also selects a bit string starting from "0" when it needs to select a binary coefficient, whereas it selects a bit string starting from "1" when it needs to select an advanced-coded coefficient.

A method for judging which data needs to be selected by the first and second selection units S1 and S2, a binary coefficient or an advanced-coded coefficient, is not particularly limited, but it is possible for the first and second selection units S1 and S2 to judge the data to be selected, for example, based on a notice from a control unit not shown in the diagram. For example, the control unit may notify the first and second selection units S1 and S2 so that they select an advanced-coded coefficient when an image to be coded is complicated, and a binary coefficient when an image to be coded is not complicated.

With this structure of the fifth embodiment, an advanced-coding process is performed only when needed, it is possible to minimize the load on the advanced-coding process, as well as to reduce the amount of data to be stored in the bin buffer.

In addition, although the present embodiment shows, as an example, the structure in which a selection bit is attached to each DCT coefficient, the present invention is not limited to this structure. In other words, a selection bit may be attached to each macroblock, each slice or each picture. A data unit to which a selection bit is attached is not particularly limited. If the selection bit is attached to each smaller data unit, more detailed selection can be made, but at the same time, the number of selection bits attached to the-entire video data increases. Therefore, it is preferable to determine the data unit to which the selection bit is attached, depending on the applications of the present invention.

Figure 18:
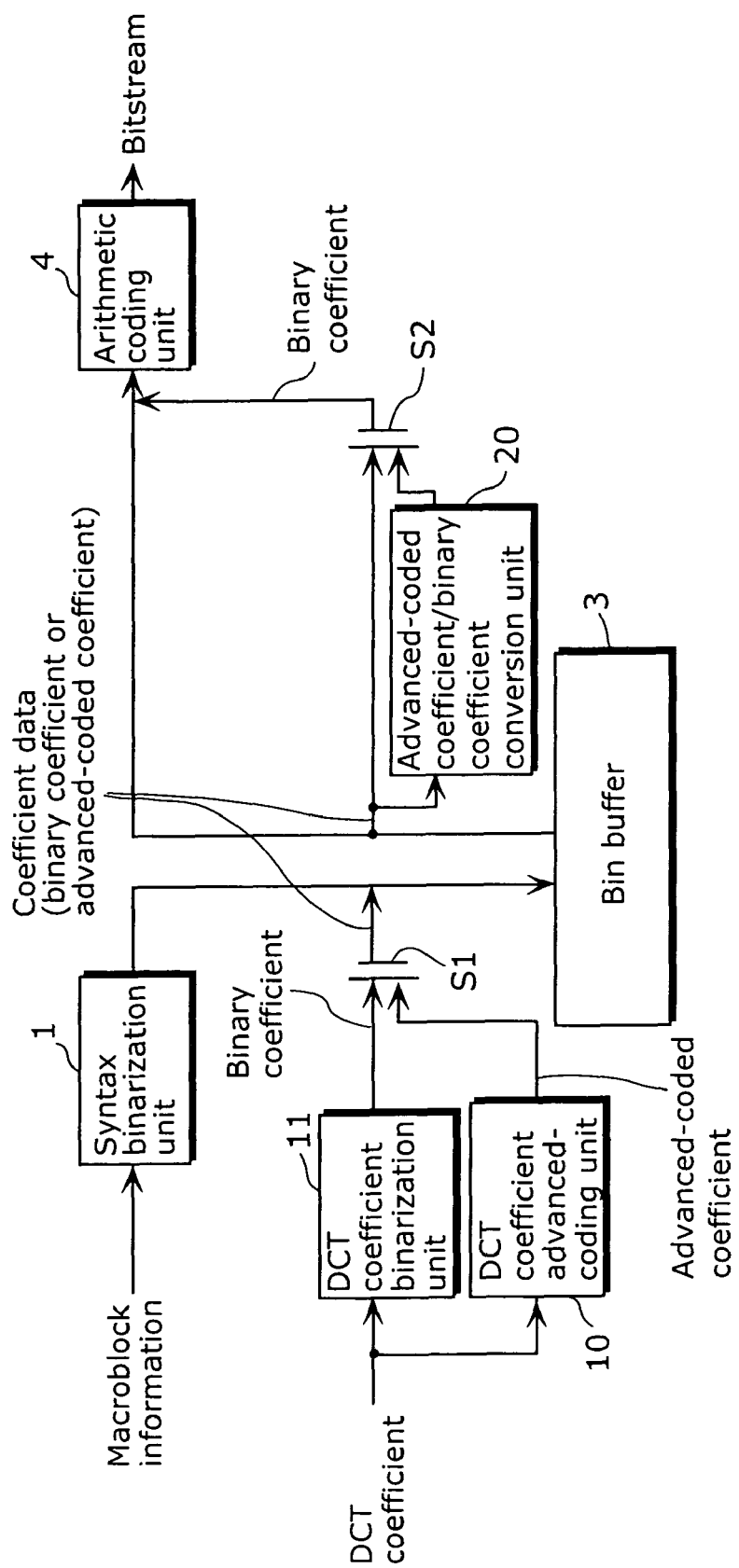
FIG. 18 is a diagram which shows another structure of the CABAC coding apparatus in the fifth embodiment.

FIG. 18 is a diagram which shows another structure of the fifth embodiment including the first selection unit S1 and the second selection unit S2.

The first selection unit S1 selects one of binary data obtained by the DCT coefficient binarization unit 11 and advanced-coded data obtained by the DCT coefficient advanced-coding unit 10, and outputs the selected data to the bin buffer 3. As described above, the DCT coefficient advanced-coding unit 10 derives an advanced-coded coefficient directly from a DCT coefficient based on the judgment of the value of the DCT coefficient.

The present embodiment describes the case where DCT coefficients are coded, but needless to say, motion vectors are coded in the same manner.

Sixth Embodiment

The first to fifth embodiments describe an apparatus which codes DCT coefficients and the like, but the present invention can also be applied to an apparatus which decodes DCT coefficients and the like.

Figure 19:
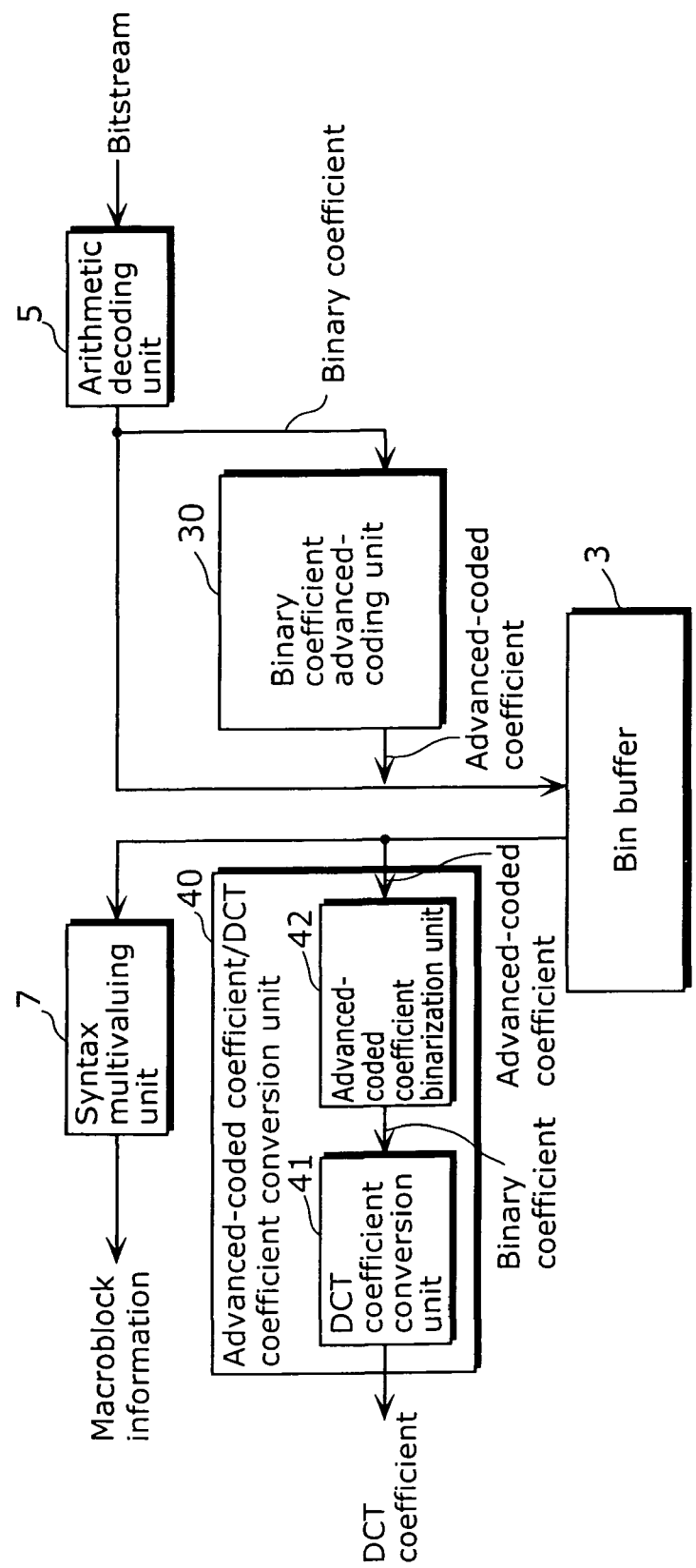
FIG. 19 is a diagram which shows a structure of a CABAC decoding apparatus in the sixth embodiment.

FIG. 19 is a diagram which shows a structure of a CABAC decoding apparatus in the sixth embodiment. This CABAC decoding apparatus is an apparatus which decodes data regarding moving pictures, and includes, in terms of function, an arithmetic decoding unit 5, a binary coefficient advanced-coding unit 30, a bin buffer 3, an advanced-coded coefficient binarization unit 42, a DCT coefficient conversion unit 41, and a syntax multivaluing unit 7.

The arithmetic decoding unit 5 is an arithmetic decoding circuit or the like which applies an arithmetic decoding to arithmetic-coded data so as to output a binary coefficient. The binary coefficient advanced-coding unit 30 is an advanced-coding circuit or the like which performs advanced-coding on a binary coefficient and outputs an advanced-coded coefficient. The advanced-coded coefficient binarization unit 42 is a conversion circuit or the like which converts an advanced-coded coefficient into a binary coefficient and outputs the resulting data. The DCT coefficient conversion unit 41 is a conversion circuit or the like which converts a binary coefficient into a multivalued (non-binary) coefficient and outputs the quantized DCT coefficient. The syntax multivaluing unit 7 is a multivaluing circuit or the like which converts a binarized syntax element into a multivalued element and outputs the quantized syntax element.

In the sixth embodiment, the same advanced-coding methods as described in the first to fourth embodiments are adopted. With this structure of the sixth embodiment, since the maximum bit length of a binary coefficient is reduced, as in the CABAC coding apparatus, it is possible to reduce the maximum data transmission rate. As mentioned above, by reducing the maximum data transmission rate to the bin buffer 3, the maximum bandwidth of the bin buffer 3 can be reduced.

Figure 20:
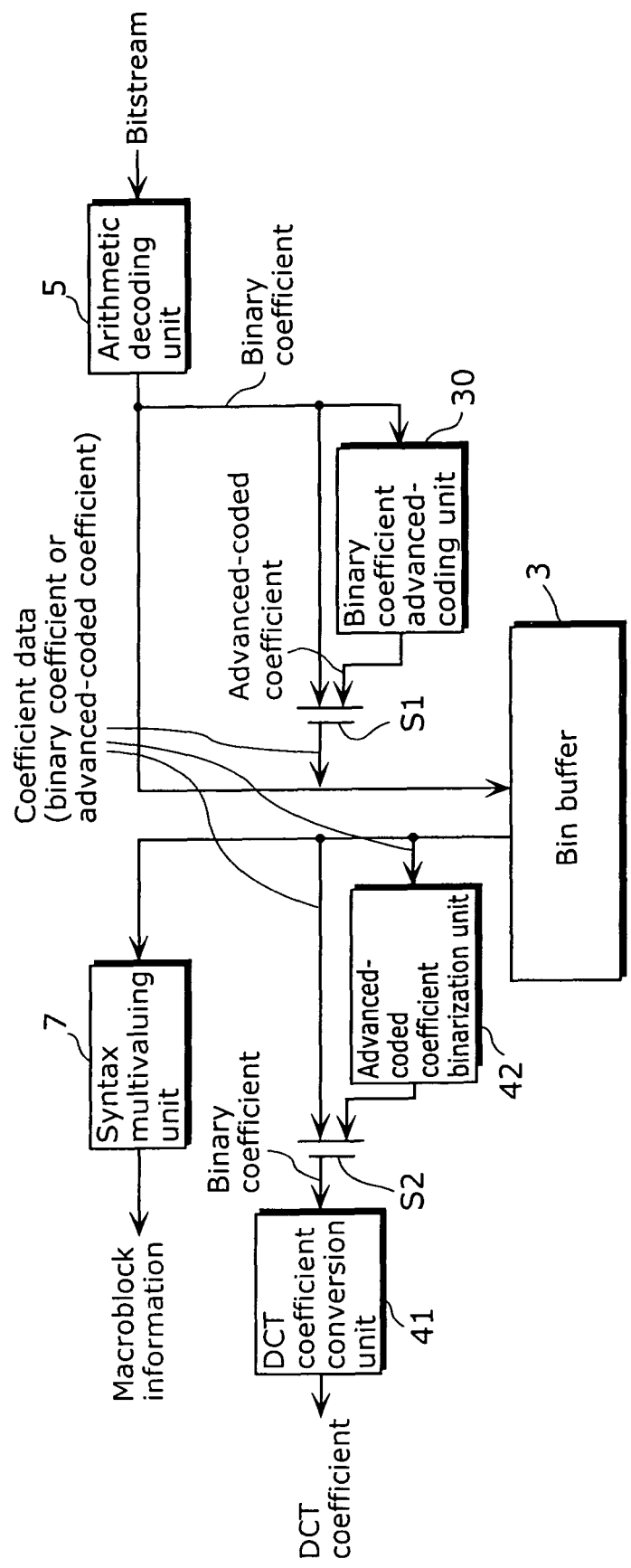
FIG. 20 is a diagram which shows another structure of the CABAC decoding apparatus in the sixth embodiment.
Figure 21:
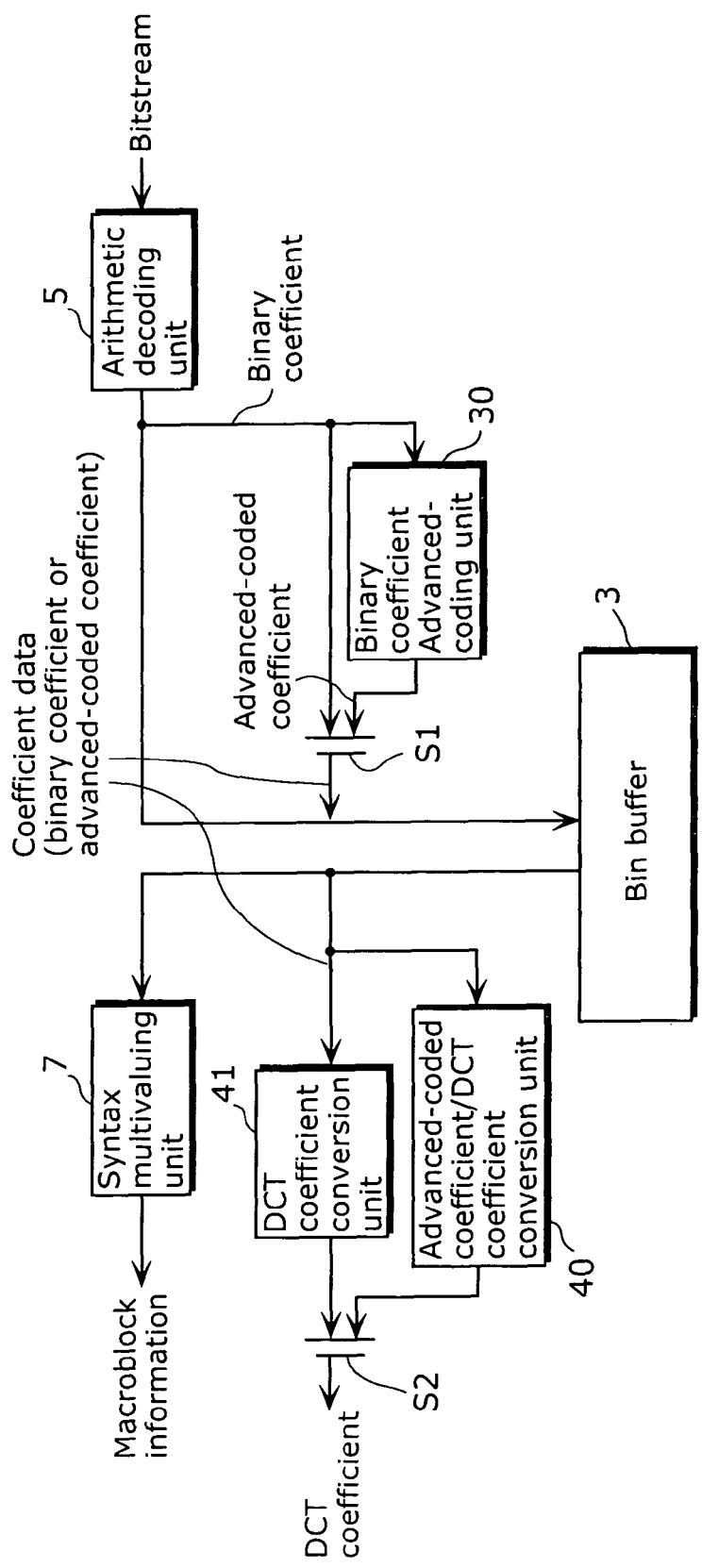
FIG. 21 is a diagram which shows still another structure of the CABAC decoding apparatus in the sixth embodiment.

Note that the CABAC decoding apparatus may include the first selection unit S1 and the second selection unit S2 described in the fifth embodiment. FIG. 20 and FIG. 21 are diagrams which respectively show another structure of the CABAC decoding apparatus including the first selection unit S1 and the second selection unit S2. FIG. 20 shows a CABAC decoding apparatus which corresponds to the CABAC coding apparatus shown in FIG. 16, whereas FIG. 21 shows a CABAC decoding apparatus which corresponds to the CABAC coding apparatus shown in FIG. 18. Since the function of each element has already been described, the description thereof is not repeated here.

The present embodiment describes the case where DCT coefficients are decoded, but needless to say, motion vectors are decoded in the same manner.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The coding apparatus and the decoding apparatus according to the present invention can be applied for use in a CABAC coding apparatus and a CABAC decoding apparatus and the like which are required to reduce the maximum data transmission rate.

What is claimed is:

1. A coding apparatus which codes data regarding a moving picture, comprising:
    a multivalued data advanced-coding unit operable to perform advanced-coding on multivalued data representing one of a quantized DCT coefficient and a motion vector, so as to reduce a bit length of binary data obtained by binarizing the multivalued data;
    a memory in which the advanced-coded data obtained by said multivalued data advanced-coding unit is stored;
    a conversion unit operable to read the advanced-coded data from said memory and convert the advanced-coded data read from said memory into the binary data; and
    an arithmetic coding unit operable to perform arithmetic coding on the binary data obtained by said conversion unit.

2. The coding apparatus according to claim 1,
    wherein said multivalued data advanced-coding unit is operable to perform advanced-coding on the multivalued data so as to reduce the bit length of the binary data, when the bit length of the binary data is larger than a predetermined length.

3. The coding apparatus according to claim 1,
    wherein said multivalued data advanced-coding unit is operable to perform advanced-coding on the multivalued data so as to reduce a bit length of the binary data having the largest value.

4. The coding apparatus according to claim 1,
    wherein said multivalued data advanced-coding unit includes:
    a binarization unit operable to binarize the multivalued data; and
    an advanced-coding unit operable to perform advanced-coding on the binary data obtained by said binarization unit, and
    said conversion unit is operable to convert the advanced-coded data obtained by said advanced-coding unit into the binary data.

5. The coding apparatus according to claim 4,
    wherein said advanced-coding unit is operable to identify whether or not the bit length of the binary data obtained by said binarization unit is equal to or less than a predetermined length, to hold a value indicating the identification as an identification bit, and (i) to attach, to the binary data, the identification bit of a value indicating binary data when the bit length of the binary data is equal to or less than the predetermined length and (ii) to attach, to the multivalued data, the identification bit of a value indicating multivalued data when the bit length of the binary data is larger than the predetermined length, and
    said conversion unit is operable to convert the advanced-coded data into the binary data (i) by obtaining a bit string from which the identification bit is excluded, when the identification bit indicating binary data is attached to the advanced-coded data obtained by said advanced-coding unit and (ii) by binarizing a bit string from which the identification bit is excluded, when the identification bit indicating multivalued data is attached to the advanced-coded data.

6. The coding apparatus according to claim 5,
    wherein the predetermined length is a bit length of the multivalued data.

7. The coding apparatus according to claim 4,
    wherein said advanced-coding unit is operable to perform advanced-coding on the binary data obtained by said binarization unit by appending a second bit string to a first bit string representing the number of consecutive 1s from the beginning of the bit string of the binary data, the second bit string following 0 which appears first in the bit string of the binary data, and
    said conversion unit is operable to convert the advanced-coded data obtained by said advanced-coding unit into the binary data by appending 0 and the second bit string to a sequence of as many 1s as the number of consecutive 1s represented by the first bit string.

8. The coding apparatus according to claim 7,
    wherein a bit length of the first bit string is a minimum bit length required to represent the largest number of consecutive 1s from the beginning of the bit string of the binary data.

9. The coding apparatus according to claim 4, further comprising:
    a first selection unit, placed in a stage previous to said buffer, operable to select one of the binary data obtained by said binarization unit and the advanced-coded data obtained by said advanced-coding unit; and a second selection unit, placed in a stage previous to said arithmetic coding unit, operable to select the binary data which is temporarily stored in said buffer when said first selection unit selects the binary data and to select the binary data obtained by said conversion unit when said first selection unit selects the advanced-coded data.

10. The coding apparatus according to claim 9,
wherein said binarization unit is operable to attach, to the beginning of the binary data, a selection bit of a value indicating that binary data should be selected,
said advanced-coding unit is operable to attach, to the beginning of the advanced-coded data, the selection bit of a value indicating that advanced-coded data should be selected, and
said first selection unit and said second selection unit are each operable to select one of the binary data and the advanced-coded data by referring to the value of the selection bit.

11. The coding apparatus according to claim 10,
wherein the selection bit is attached to one of each DCT coefficient, each motion vector, each macroblock, each slice and each picture.

12. The coding apparatus according to claim 1,
wherein the DCT coefficient is coeff_abs_level_minus1 in H.264/AVC.

13. The coding apparatus according to claim 1,
wherein the binary data is Golomb-coded data.

14. A decoding apparatus which decodes data regarding a moving picture, comprising:
an arithmetic decoding unit operable to perform arithmetic decoding on arithmetic-coded data to generate binary data;
an advanced-coding unit operable to perform advanced-coding on the binary data obtained by said arithmetic decoding unit, so as to reduce a bit length of the binary data;
a memory in which the advanced-coded data obtained by said advanced-coding unit is stored; and
an advanced-coded data conversion unit operable to read the advanced-coded data from said memory and convert the advanced-coded data read from said memory into one of a quantized DCT coefficient and a motion vector.

15. The decoding apparatus according to claim 14,
wherein said advanced-coding unit is operable to perform advanced-coding on the binary data so as to reduce the bit length of the binary data, when the bit length of the binary data is larger than a predetermined length.

16. The decoding apparatus according to claim 14,
wherein said advanced-coding unit is operable to perform advanced-coding on the binary data so as to reduce a bit length of the binary data having the largest value.

17. The decoding apparatus according to claim 14,
wherein said advanced-coded data conversion unit includes:
a first conversion unit operable to convert the advanced-coded data obtained by said advanced-coding unit into the binary data; and
a second conversion unit operable to convert the binary data obtained by said first conversion unit into one of the quantized DCT coefficient and the motion vector.

18. The decoding apparatus according to claim 17,
wherein said advanced-coding unit is operable to identify whether or not the bit length of the binary data obtained by said arithmetic decoding unit is equal to or less than a predetermined length, to hold a value indicating the identification as an identification bit, and (i) to attach, to the binary data, the identification bit of a value indicating binary data when the bit length of the binary data is equal to or less than the predetermined length and (ii) to attach, to the arithmetic-coded data, the identification bit of a value indicating arithmetic-coded when the bit length of the binary data is larger than the predetermined length, and
said first conversion unit is operable to convert the advanced-coded data into the binary data (i) by obtaining a bit string from which the identification bit is excluded, when the identification bit indicating binary data is attached to the advanced-coded data obtained by said advanced-coding unit and (ii) by converting, into the binary data, a bit string from which the identification bit is excluded, when the identification bit indicating arithmetic-coded data is attached to the advanced-coded data.

19. The decoding apparatus according to claim 18,
wherein the predetermined length is a bit length of the arithmetic-coded data.

20. The decoding apparatus according to claim 17,
wherein said advanced-coding unit is operable to perform advanced-coding on the binary data obtained by said arithmetic decoding unit by appending a second bit string to a first bit string representing the number of consecutive 1s from the beginning of the bit string of the binary data, the second bit string following 0 which appears first in the bit string of the binary data, and
said first conversion unit is operable to convert, into the binary data, the advanced-coded data obtained by said advanced-coding unit, by appending 0 and the second bit string to a sequence of as many 1s as the number of consecutive 1s represented by the first bit string.

21. The decoding apparatus according to claim 20,
wherein a bit length of the first bit string is a minimum bit length required to represent the largest number of consecutive 1s from the beginning of the bit string of the binary data.

22. The decoding apparatus according to claim 17, further comprising:
a first selection unit, placed in a stage previous to said buffer, operable to select one of the binary data obtained by said arithmetic decoding unit and the advanced-coded data obtained by said advanced-coding unit; and
a second selection unit, placed in a stage previous to said second conversion unit, operable to select the binary data which is temporarily stored in said buffer when said first selection unit selects the binary data and to select the binary data obtained by said first conversion unit when said first selection unit selects the advanced-coded data.

23. The decoding apparatus according to claim 22,
wherein said arithmetic decoding unit is operable to attach, to the beginning of the binary data, a selection bit of a value indicating that binary data should be selected,
said advanced-coding unit is operable to attach, to the beginning of the advanced-coded data, the selection bit of a value indicating that advanced-coded data should be selected, and
said first selection unit and said second selection unit are each operable to select one of the binary data and the advanced-coded data by referring to the value of the selection bit.

24. The decoding apparatus according to claim 23,
wherein the selection bit is attached to one of each DCT coefficient, each motion vector, each macroblock, each slice and each picture.

25. The decoding apparatus according to claim 14, wherein the DCT coefficient is coeff_abs_level_minus1 in H.264/AVC.

26. The decoding apparatus according to claim 14, wherein the binary data is Golomb-coded data.

27. A coding method of coding data regarding a moving picture, comprising:
performing advanced-coding on multivalued data representing one of a quantized DCT coefficient and a motion vector, so as to reduce a bit length of binary data obtained by binarizing the multivalued data;
storing the advanced-coded data in a memory;
converting the advanced-coded data stored in the memory and obtained in said performing of advanced-coding into the binary data; and
perform arithmetic coding on the binary data obtained in said converting.

28. A decoding method of decoding data regarding a moving picture, comprising:
performing arithmetic decoding on arithmetic-coded data to generate binary data;
performing advanced-coding on the binary data obtained in said performing of arithmetic decoding, so as to reduce a bit length of the binary data;
storing the advanced-coded data in a memory; and
converting the advanced-coded data stored in the memory and obtained in said performing of advanced-coding into one of a quantized DCT coefficient and a motion vector.

29. An integrated circuit which codes data regarding a moving picture, comprising:
a multivalued data advanced-coding unit operable to perform advanced-coding on multivalued data representing one of a quantized DCT coefficient and a motion vector, so as to reduce a bit length of binary data obtained by binarizing the multivalued data;
a memory in which the advanced-coded data obtained by said multivalued data advanced-coding unit is stored;
a conversion unit operable to read the advanced-coded data from said memory and convert the advanced-coded data read from said memory into the binary data; and
an arithmetic coding unit operable to perform arithmetic coding on the binary data obtained by said conversion unit.

30. An integrated circuit which decodes data regarding a moving picture, comprising:
an arithmetic decoding unit operable to perform arithmetic decoding on arithmetic-coded data to generate binary data;
an advanced-coding unit operable to perform advanced-coding on the binary data obtained by said arithmetic decoding unit, so as to reduce a bit length of the binary data;
a memory in which the advanced-coded data obtained by said advanced-coding unit is stored; and
an advanced-coded data conversion unit operable to read the advanced-coded data from said memory and convert the advanced-coded data read from said memory into one of a quantized DCT coefficient and a motion vector.

* * * * *